US007007254B1

(12) United States Patent
Borkovic et al.

(10) Patent No.: US 7,007,254 B1
(45) Date of Patent: Feb. 28, 2006

(54) METHOD AND APPARATUS FOR THE DESIGN AND ANALYSIS OF DIGITAL CIRCUITS WITH TIME DIVISION MULTIPLEXING

(75) Inventors: Drazen Borkovic, Mtn. View, CA (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 64 days.

(21) Appl. No.: 10/346,934

(22) Filed: Jan. 17, 2003

(51) Int. Cl.
G06F 17/50 (2006.01)
(52) U.S. Cl. .................................. 716/6; 716/4; 716/5
(58) Field of Classification Search ................ 716/4–6, 716/12, 16; 713/400–401; 370/396, 468
See application file for complete search history.

(56) References Cited

U.S. PATENT DOCUMENTS

| | | | | |
|---|---|---|---|---|
| 5,410,678 A | * | 4/1995 | Takasaki ....................... 703/15 |
| 5,596,742 A | * | 1/1997 | Agarwal et al. ............... 716/16 |
| 5,602,830 A | * | 2/1997 | Fichou et al. ................. 370/232 |
| 5,649,176 A | * | 7/1997 | Selvidge et al. ............ 713/400 |
| 5,761,484 A | | 6/1998 | Agarwal et al. |
| 5,847,578 A | | 12/1998 | Noakes et al. |
| 5,850,537 A | * | 12/1998 | Selvidge et al. ............... 716/12 |
| 5,854,752 A | | 12/1998 | Agarwal |
| 6,009,256 A | * | 12/1999 | Tseng et al. ................... 703/13 |
| 6,009,531 A | * | 12/1999 | Selvidge et al. ............. 713/400 |
| 6,223,328 B1 | * | 4/2001 | Ito et al. ......................... 716/6 |
| 6,321,366 B1 | * | 11/2001 | Tseng et al. .................... 716/6 |
| 6,377,912 B1 | * | 4/2002 | Sample et al. ................ 703/28 |
| 6,785,873 B1 | * | 8/2004 | Tseng ............................. 716/4 |

* cited by examiner

Primary Examiner—Matthew Smith
Assistant Examiner—Naum Levin
(74) Attorney, Agent, or Firm—Blakely, Sokoloff, Taylor & Zafman LLP

(57) ABSTRACT

Methods and apparatuses to design and analyze digital circuits with time division multiplexing. At least one embodiment of the present invention efficiently models subsystems connected by a TDM channel by introducing equivalent delays in the connections for the subsystems, where the delays are determined according to the upper bounds of the delays caused by the TDM channel. The TDM channel is modeled with its equivalent delays. Thus, a transformation tool is allowed to take into account the original constraints and time budgeting of the sending subsystem and the receiving subsystem. The problem of asynchronous clock domains is eliminated; and, simulation time of the multiplexed circuit is also improved. In some embodiments of the present invention, multiple TDM slots are assigned to a particular signal to reduce the equivalent connection delay caused by the TDM channel for the particular signal. In some embodiments of the present invention, timing simulation is performed using the equivalent delays to avoid the simulation of the TDM hardware; and, the simulation time step does not have to be reduced due to asynchronous clock, resulting in reduced simulation time.

36 Claims, 20 Drawing Sheets

METHOD AND APPARATUS FOR THE DESIGN AND ANALYSIS OF DIGITAL CIRCUITS WITH TIME DIVISION MULTIPLEXING

FIELD OF THE INVENTION

The invention relates to digital circuits, and more particularly to the design and analysis of digital circuits with Time Division Multiplexing (TDM) for digital signals.

BACKGROUND OF THE INVENTION

For the design of digital circuits on the scale of VLSI (very large scale integration) technology, designers often employ computer aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

Controlling timing problems is an important aspect of designing a digital circuit. At various stages of a design process (e.g, synthesis, placement, routing, floor planning, partitioning, optimization, and others), timing analyses are performed to budget and/or verify timing. For example, after placement of components on the chip and routing of wires between components, timing analysis (e.g., timing simulation, or static timing analysis) can be performed to accurately determine the signal delays between logic elements in order to determine whether or not timing requirements are satisfied. In the floor planning operation, timing analysis can be performed to budget delays. Some transformations (e.g., from the HDL code to an RTL netlist, from a technology independent RTL netlist to a technology specific netlist, optimization, and others) are timing driven.

One parameter for describing timing requirements is slack. Slack is the difference between the desired delay and the actual (estimated or computed) delay. When the desired delay is larger than the actual delay, the slack is positive; otherwise, the slack is negative. Typically, it is necessary to make the slack positive (or close to zero) to meet the timing requirement.

Time Division Multiplexing (TDM) channels have been used in digital circuits to allow multiple connections to share one or more physical wires in transmitting signals between chips and circuit boards. The presence of TDM channels in a digital circuit greatly increases the complexity of timing analyses.

An electronic system involving transmission of data typically uses at least one physical communication links (e.g., wires) between the sender and the receiver. Examples of communication links include: computer networks, telephone networks, a cable connecting a computer and a printer, traces on a printed circuit board that connect the chips on the board, and others.

As systems grow more complex and more data needs to be transmitted, more physical connections may be used to transfer the data. However, the cost of the physical communication links is one of the important factors that determine the cost of the system. Time Division Multiplexing (TDM) is one of the techniques for reducing the amount of required physical communication links.

Typically, on the sending side of a TDM channel, the signals from different connections are stored into a sender queue. The stored signals are sequentially sent one signal at a time over a shared physical communication link of the TDM channel. On the receiving side, signals are received in the order they are sent and stored in the receiver queue. After the signals for all the different connections are sent sequentially from the sender queue through the TDM channel to the receiver queue, a next cycle is repeated to send more signals for the connections. Thus, the TDM channel provides a shared communication channel, in which signals for all the connections are sent in different time slots in a cycle using the shared physical communication link. Some TDM channels use more than one physical communication link; and, some TDM channels encode multiple signals to send them through more than one physical wire.

A TDM channel typically operates according to its own clock signal. The TDM scheme is synchronous when the TDM clock and the system clock are synchronized; and, it is asynchronous when they are not. The presence of a TDM channel, especially an asynchronous TDM channel, greatly increases the complexity of timing analysis, because of the complex logic of the TDM channel and the addition of the clock domain for the TDM channel. The signal on the sender side belongs to the system clock domain. It is transferred to the TDM clock domain for transmission in the TDM channel and then to the system clock domain on the receiver side. Additional difficulty is posed by the asynchronicity of the TDM clock domain in an asynchronous TDM channel.

SUMMARY OF THE DESCRIPTION

Methods and apparatuses to design and analyze digital circuits with time division multiplexing are described here. Some embodiments of the present inventions are summarized in this section.

At least one embodiment of the present invention efficiently models subsystems connected by a TDM channel by introducing equivalent delays in the connections for the subsystems, where the delays are determined according to the upper bounds of the delays caused by the TDM channel. The TDM channel is modeled with its equivalent delays. Thus, a transformation tool is allowed to take into account the original constraints and time budgeting of the sending subsystem and the receiving subsystem. The problem of asynchronous clock domains is eliminated; and, simulation time of the multiplexed circuit is also improved. In some embodiments of the present invention, multiple TDM slots are assigned to a particular signal to reduce the equivalent connection delay caused by the TDM channel for the particular signal. In some embodiments of the present invention, timing simulation is performed using the equivalent delays to avoid the simulation of the TDM hardware; and, the simulation time step does not have to be reduced due to asynchronous clock, resulting in reduced simulation time.

In one aspect of the invention, a method for timing analyses of a digital circuit includes: determining a plurality of equivalent delays for a plurality of connections provided by a Time Division Multiplexing (TDM) channel according to one or more upper bounds of signal delays caused by the TDM channel for the plurality of connections of the digital circuit; and performing a timing analysis of a portion of the digital circuit using the plurality of equivalent delays. In one example, each of the one or more upper bounds includes: 1) a component due to the uncertainty in the arrival of an input signal at an input end of the TDM channel with respect to the timing of signal sampling for transmission the input signal through the TDM channel; and, 2) a component due to the uncertainty in the timing of generating an output signal at an output end of the TDM channel with respect to the timing of sampling the output signal according to a system clock of the digital circuit. In one example, the clock signal of the TDM channel and the system clock of the digital circuit are asynchronous. In one example, the timing analysis determines a timing constraint for a portion of the digital circuit. In one example, a timing driven transformation (e.g., synthesizing a portion of the digital circuit, placing and routing a portion of the digital circuit, partitioning a portion of the digital circuit, floor planning a portion of the digital circuit, or others) of a portion of the digital circuit is performed using the result of the timing analysis. In one example, the timing analysis includes a timing simulation using the plurality of equivalent delays. In another example, the plurality of connections in the digital circuit are identified; and, the TDM channel is inserted to provide for the plurality of connections. The slots of the TDM channel are assigned to the plurality of connections according to the timing requirements of the connections. In one example, a plurality of the slots of the TDM channel are assigned to one of the plurality of connections to reduce the delay for this connection.

In at least one embodiment of the present invention, a method for designing a digital circuit includes automatically replacing nets for a plurality of connections in the digital circuit with a Time Division Multiplexing (TDM) channel. In one example, signal timing for a portion of the digital circuit is determined using upper bounds of signal delays caused by the TDM channel for the plurality of connections in the digital circuit. In one example, the nets are replaced with the TDM channel in response to a determination of routing congestion. In one example, the nets are selected based on slack (e.g., from multi-cycle paths, false paths and slow clock paths) before they are replaced with the TDM. The plurality of connections can also be inter-chip connections and/or inter-board connections. In one example, time slots of the TDM channel are distributed to the plurality of connections according to timing requirements; and, a plurality of slots are assigned to one of the plurality of connections.

In one embodiment of the present invention, a method for designing a digital circuit includes determining a number of time slots allocated for a connection in a Time Division Multiplexing (TDM) channel. In one example, at least one additional slot is allocated to the connection until a timing requirement for the connection is satisfied; and, the time slots allocated for the connection is distributed to improve timing for the connection. In one example, the time slots allocated for the connection are so distributed that they are substantially evenly spaced.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Many of the methods of the present invention may be performed with a digital processing system, such as a conventional, general purpose computer system. Special purpose computers which are designed or programmed to perform only one function may also be used.

Figure 1:
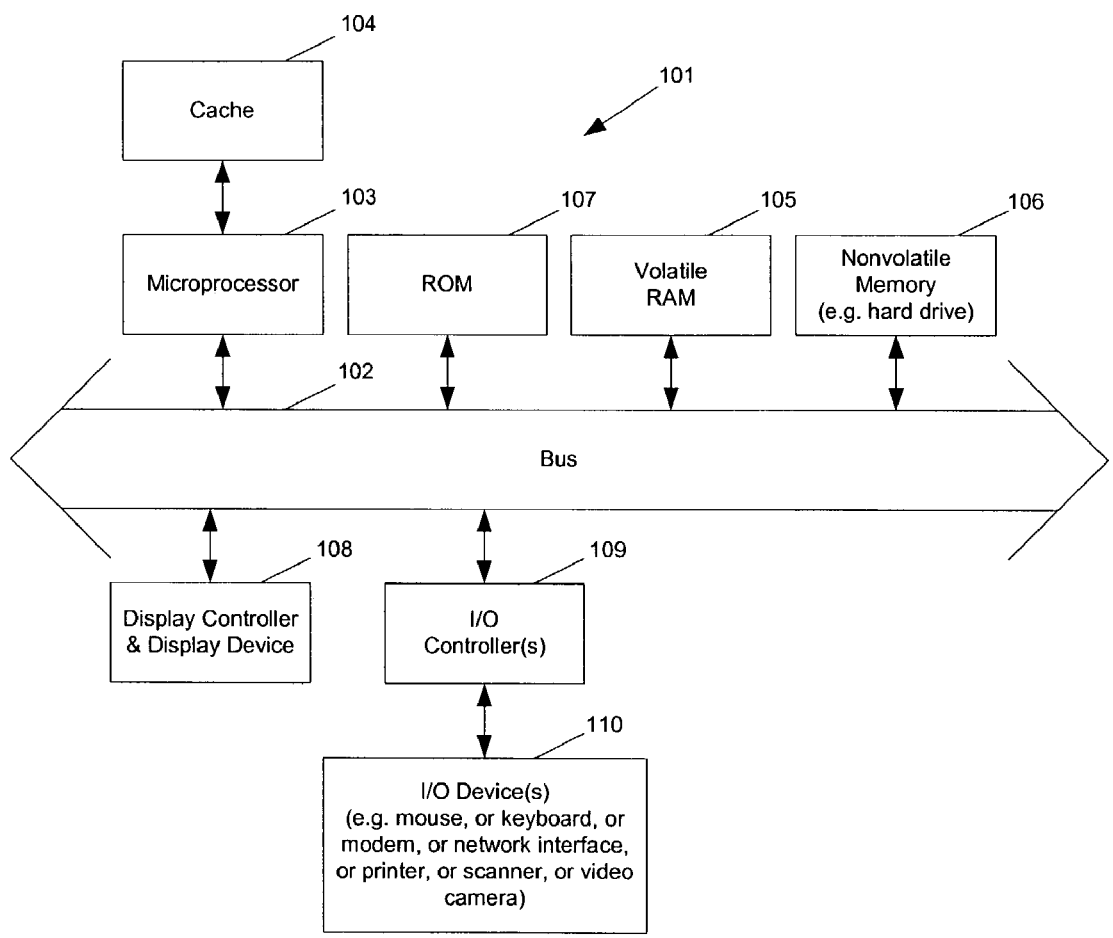
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109.

The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

At least one embodiment of the present invention seeks to budget, analyze, simulate, design and/or optimize a digital circuit with a Time Division Multiplexing (TDM) channel using upper bounds of the delays caused by the TDM channel in the connections provided by the TDM channel.

Some embodiments of the present invention seek to automatically implement TDM channels for on chip circuitry to reduce on chip routing congestion.

Figure 2:
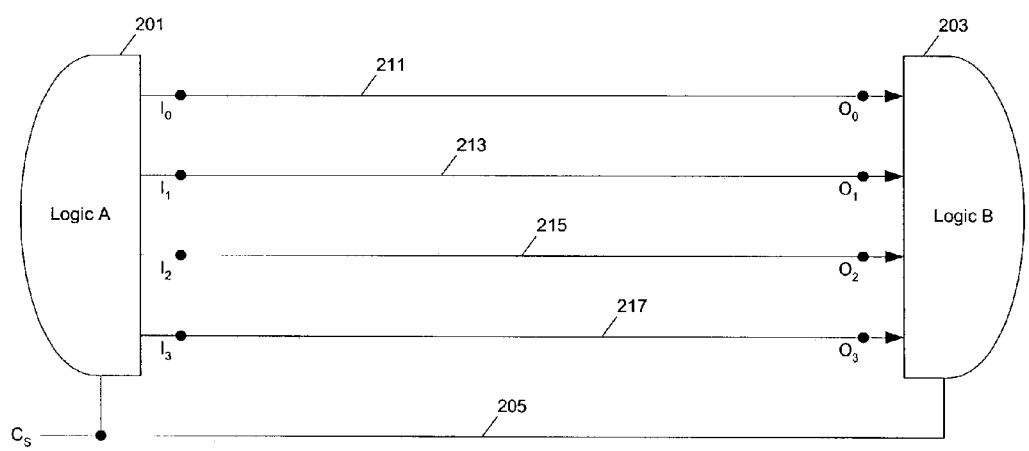
FIG. 2 illustrates a digital circuit with a plurality of connections between distant regions.

FIG. 2 illustrates a digital circuit with a plurality of connections between distant regions. Typically, logic blocks 201 and 203, linked together by connections 211–217, operate according to a common clock signal $C_S$ provided on clock line 205. When a large distance separates logic blocks 201 and 203 apart, a number of long wires are used to provide connections 211–217. To reduce the number of long wires connecting the logic blocks, the signals for connections 211–217 can be sampled at a location close to the sending block (201), sent sequentially through one (or more) shared long wire, and reconstructed at a location close to the receiving block (203) using a Time Division Multiplexing (TDM) channel (not shown in FIG. 2).

Figure 3:
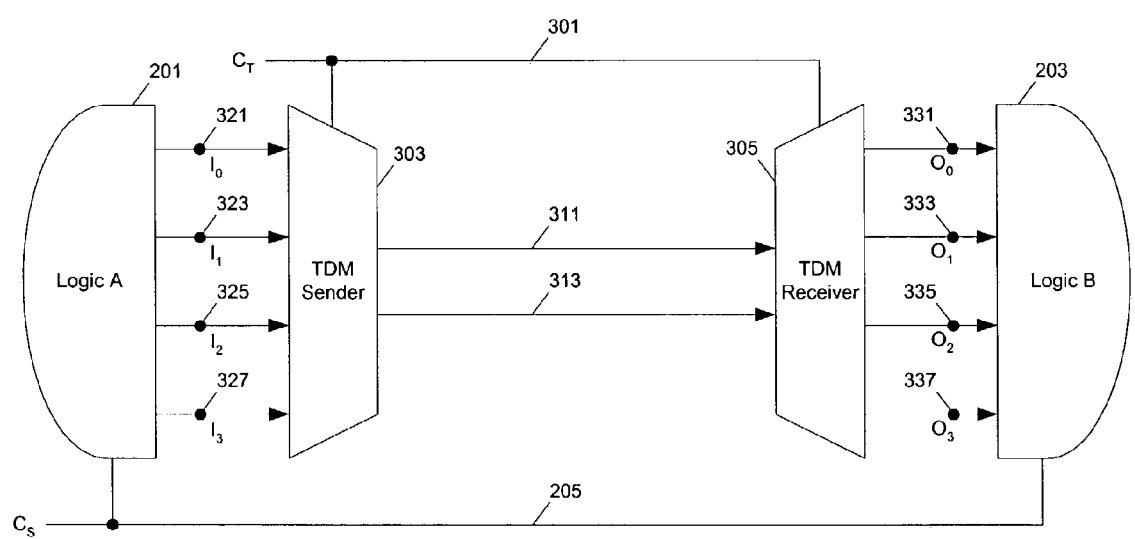
FIG. 3 illustrates a digital circuit with a Time Division Multiplexing (TDM) channel providing a plurality of connections between distant regions.

FIG. 3 illustrates a digital circuit with a Time Division Multiplexing (TDM) channel providing a plurality of connections between distant regions. In FIG. 3, TDM sender 303, which is near sending logic block 201, samples the signals on lines 321–327. The sampled signals are sent sequentially through the shared wires 311 and 313 to TDM receiver 305, which is near receiving logic block 203. TDM receiver 305 reconstructs the signals on lines 331–337 according to the received signals from wires 311 and 313. The TDM sender and the TDM receiver typically operate according to a different clock signal $C_T$ which is supplied on line 301. To reduce the delay caused by the TDM channel, which includes TDM sender 303, communication wires 311 and 313 and TDM receiver 305, the clock signal $C_T$ (301) for the TDM channel is typically configured to have a frequency that is higher than the frequency of clock signal $C_S$ (205) for the logic blocks. Further, the clock signal $C_T$ (301) for the TDM channel may not be synchronized with the clock signal $C_S$ (205) for the logic blocks, when an asynchronous TDM channel is used. TDM sender 303 may send the signals in their original forms, or encode the signals to send them through wires 311 and 313 to TDM receiver 305, which decodes the transmitted signals.

Figure 4:
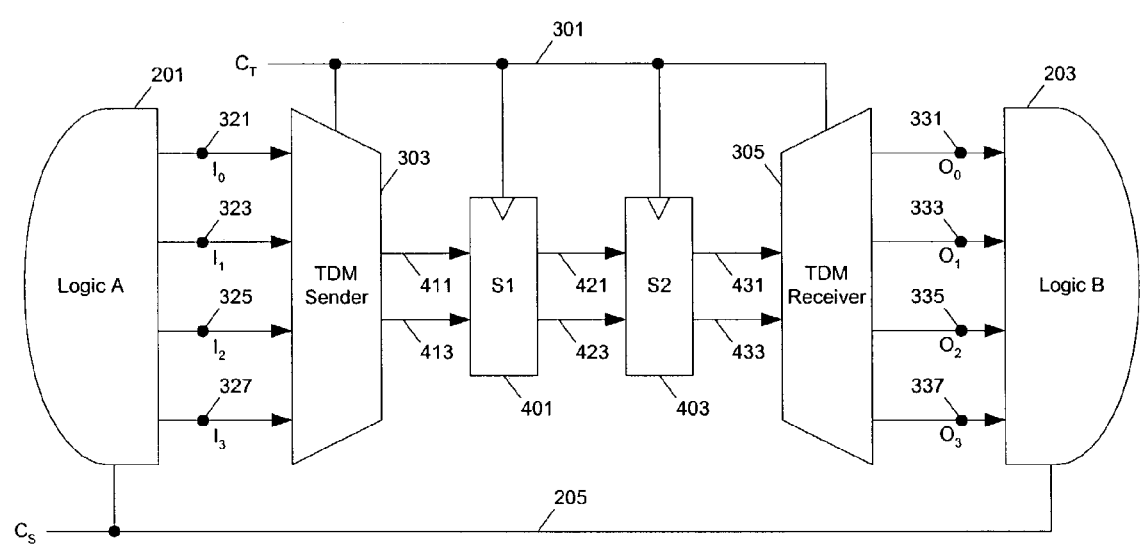
FIG. 4 illustrates a digital circuit with another Time Division Multiplexing (TDM) channel providing a plurality of connections between distant regions.

FIG. 4 illustrates a digital circuit with another Time Division Multiplexing (TDM) channel providing a plurality of connections between distant regions. In FIG. 4, sequential elements 401 and 403 (e.g., flip-flops, registers, memory elements, etc.), under control of the clock signal on line 301 for the TDM channel, are pipelined along the channel to increase the throughput when the wire delay between the TDM sender and TDM receiver without the sequential elements is longer than the period of TDM clock signal (301). In general, a number of sequential elements can be pipelined along the TDM channel.

FIGS. 3 and 4 show examples of TDM channels of a 4:2 configuration, where two physical connections are used to transmit signals for four connections. However, it is understood that TDM channels can also have various different configurations, such as a 4:1 or 8:1 configuration. It is understood that various methods described below can also be used for TDM channels of various different configurations.

Figure 5:
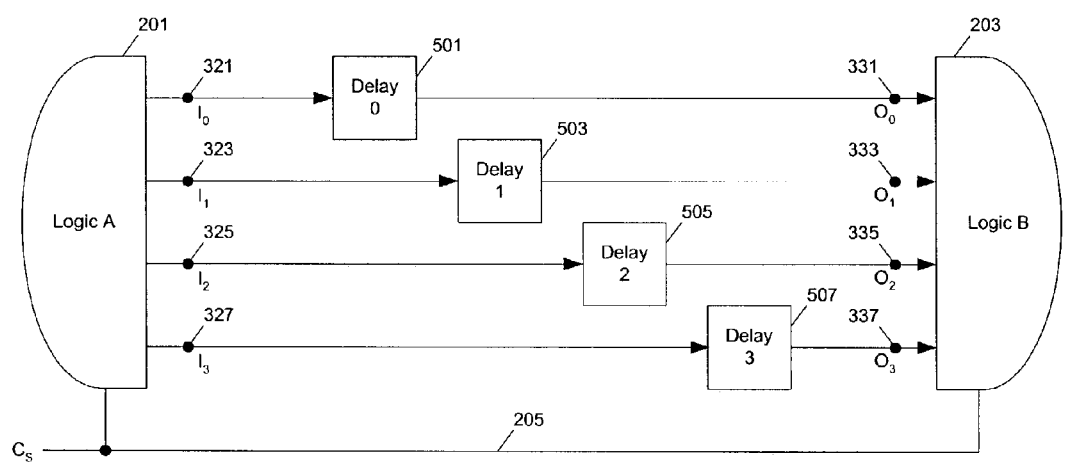
FIG. 5 illustrates a method to analyze a Time Division Multiplexing (TDM) channel according to one embodiment of the present invention.

FIG. 5 illustrates a method to analyze a Time Division Multiplexing (TDM) channel according to one embodiment of the present invention. In one embodiment of the present invention, a TDM channel is replaced with a plurality of direct wire connections with a plurality of delay elements. The delays of the plurality of delay elements correspond to the upper bounds of the signal delays for the corresponding connections caused by the TDM channel. For example, the TDM channel in FIG. 3 (or FIG. 4) can be replaced with delay elements 501–507, which provide the same connections for logic blocks 201 and 203, as the TDM channel. Since the delays for the delay elements 501–507 corresponding to the respective upper bounds of the signal delays caused by the original TDM channel, a valid circuit design according to the circuit in FIG. 5 can lead to a valid corresponding design with a TDM channel (e.g., the circuit in FIG. 3 or 4), which meets the timing requirement. Once the TDM channel is replaced with the delay elements, the timing analysis, as well as the circuit simulation, for the circuit as illustrated in FIG. 5 is greatly simplified.

Alternatively, a TDM channel can be replaced with an equivalent component that has the same connectivity and structure as the TDM channel, but without the complex logic of the TDM channel. For example, a TDM channel can be replaced with an ideal TDM channel. The ideal TDM channel provides the same connectivity between the TDM sender and the TDM receiver, between the sending logic block and the TDM sender, and between the receiving logic block and the TDM receiver, just as the original TDM channel. The ideal TDM channel causes predetermined signal delays for the connections according to the upper bounds of the signal delays caused by the original TDM channel; and, the ideal TDM channel causes the same predetermined signal delays irrespective to the states of the clock signals. For example, in FIG. 3, TDM sender 303 and TDM receiver 305 can be replaced with the ideal TDM sender and the ideal receiver which provide the same connectivity for wires 321–327, 311–313, 331–337 as TDM sender 303 and TDM receiver 305. However, the delays for the connections provided by the ideal TDM sender and the ideal TDM receiver are predetermined according to the upper bounds of the signal delays caused by the original TDM channel between TDM sender 303 and TDM receiver 305, regardless of the states of the clock signals (e.g., those on lines 301 and 205). For example, in one implementation, the ideal TDM sender causes constant delays for the signals on wires 321–327 according to the upper bound of the signal delays in the original TDM channel, while there is no delay between the wires from the ideal TDM sender and the wires for the output of the ideal TDM receiver. Thus, replacing the original TDM channel with an ideal TDM channel, which operates independently on the clock signals, greatly simplifies the timing analysis and circuit simulation.

From this description, it would be apparent to one skilled in the art that various forms of equivalent components or ideal TDM channels can be constructed based on the upper bounds of signal delays of the original TDM channel to eliminate the dependency of the original TDM channel on the states of clock signals in order to simplify the timing analysis and circuit simulation. When an ideal TDM channel is used in the design and analysis of a circuit, the complication of dependency on the states of clock signals is eliminated, while the logical representation of the circuit is preserved. The ideal TDM channel can be considered as a TDM channel operating under a clock of an infinite frequency with predetermined delay elements attached to connections provided by the channel.

Detailed examples for methods to determine the upper bounds of the signal delays caused by a TDM channel are illustrated below.

Figure 6:
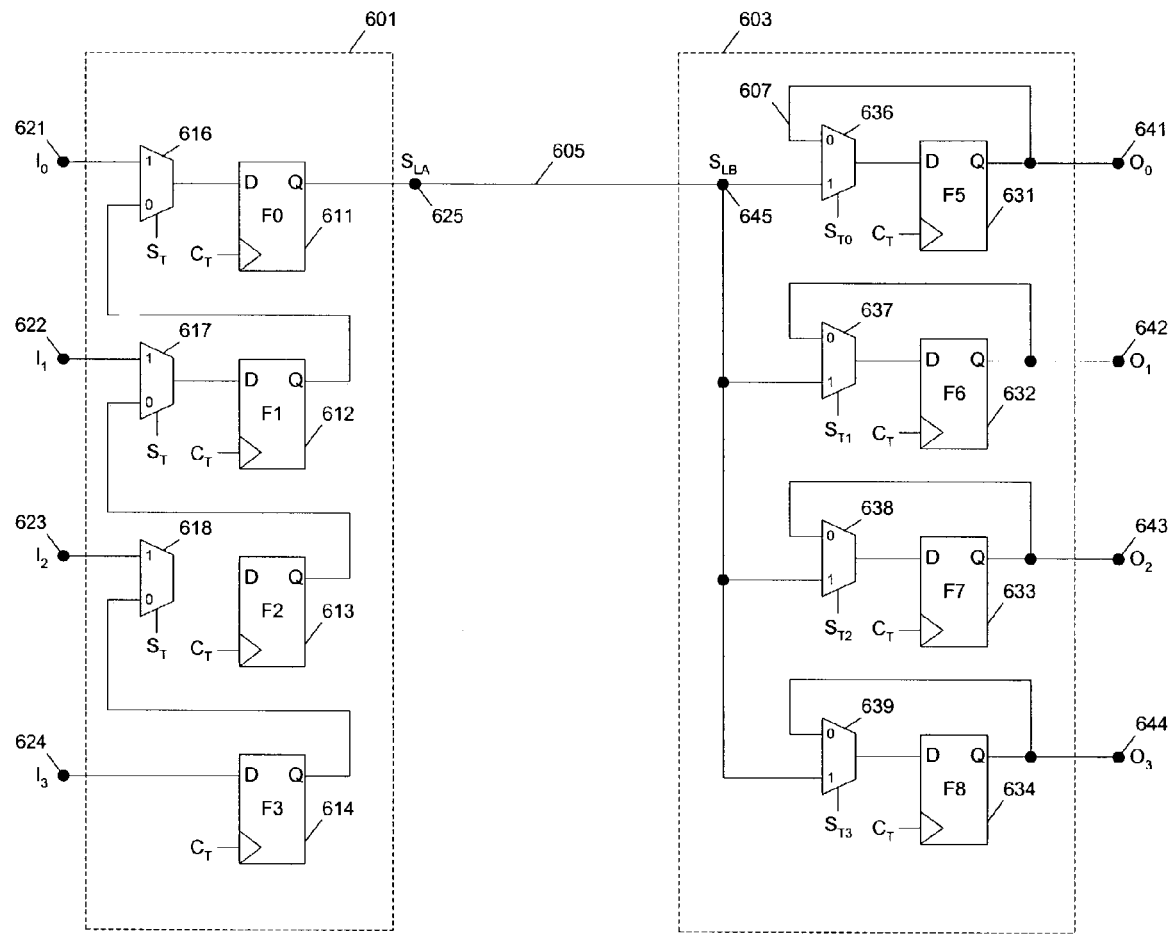
FIG. 6 illustrates a Time Division Multiplexing (TDM) channel which may be used and analyzed according to one embodiment of the present invention.

FIG. 6 illustrates a Time Division Multiplexing (TDM) channel which may be used and analyzed according to one embodiment of the present invention. In FIG. 6, at the rising edge of the TDM clock signal $C_T$, flip-flops 611–614 of TDM sender 601 sample the signals from lines 621–624 when the multiplexer control signal $S_T$ is high; and, the sampled signal are shifted through flop-flops when the multiplexer control signal $S_T$ is low. Thus, the sampled signals are sequentially transmitted from sender 601 to receiver 603 through shared wire 605. In receiver 603, flip-flops 631–634 selectively sample and hold the signals from wire 605 according to the control signals $S_{T0}$ –$S_{T3}$ to reconstruct the signals on output lines 641–644.

Figure 7:
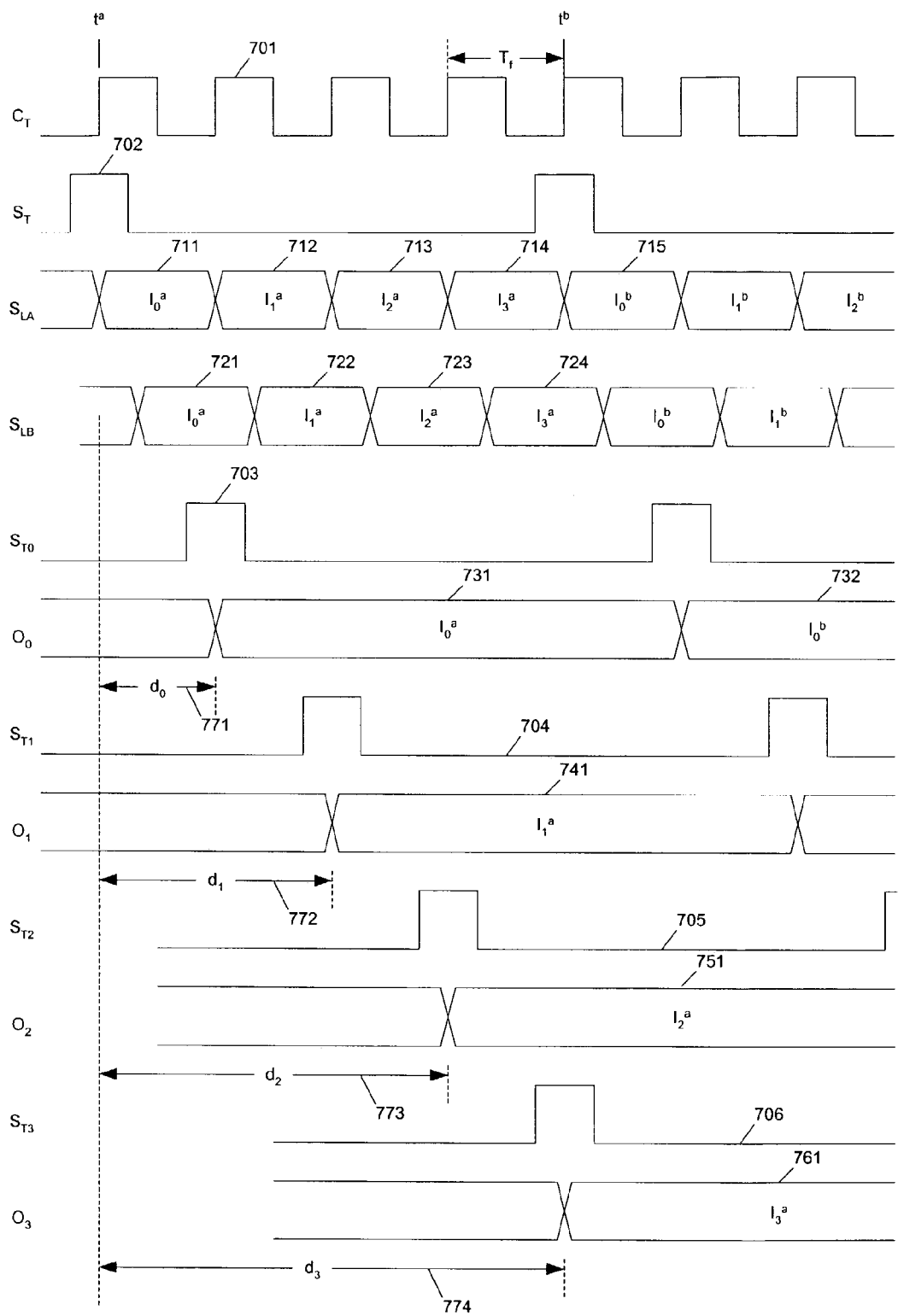
FIG. 7 shows signal waveforms at various locations in the Time Division Multiplexing (TDM) channel of FIG. 6.

FIG. 7 shows signal waveforms at various locations in the Time Division Multiplexing (TDM) channel of FIG. 6. Multiplexer control signal $S_T$ (702) is high when clock signal $C_T$ is at the rising edge at time $t^a$. Thus, flip-flops 611–614 sample the input signal states on lines 621–624 at time $t^a$. Since the multiplexer control signal $S_T$ is low for the rising edge of clock signal $C_T$ between the rising edges for sampling the input signal states (e.g., between time $t^a$ and $t^b$), the signals stored in flip-flops 611–614 are shifted sequentially from flip-flop 614 toward 611 so that the output signal of flip-flop 611 contains signals 711–714 between time $t^a$ and $t^b$. It is seen that each of signals 711–714, sampled at time $t^a$, is sequentially transmitted in a time slot from sender 601 to receiver 603 as signals 721–724. Control signal $S_{T0}$ is high when signal 721 arrives at $S_{LB}$ so that flip-flop 631 samples signal 721 from input point $S_{LB}$ and outputs signal 731 on output line 641. Between the arrivals of the signals sampled for input line 621, control signal $S_{T0}$ is low so that loop 607 causes flip-flop 631 to repeat (or hold) the same signal until the arrival of the next signal sampled (e.g., at time $t^b$) from line 621. Thus, delay $d_0$ (771) between the sampling of the signal $I_0^a$ from input line 621 at time ta and the generating of signal 731 on output line 641 according to the sampled signal $I_0^a$ is $T_f$, which is the period of the clock signal $C_T$. Similarly, control signals $S_{T1}$ (704), $S_{T2}$ (705) and $S_{T3}$ (706) cause multiplexers 637–639 and flip-flops 632–634 to reconstruct signals 741, 751 and 761 according to the signals (722–724) transmitted through wire 605 in different time slots; and, delays $d_1$ (772), $d_2$ (773) and $d_3$ (774) for signals $I_1^a$, $I_2^a$ and $I_3^a$ are $2T_f$, $3T_f$ and $4T_f$ respectively.

Figure 8:
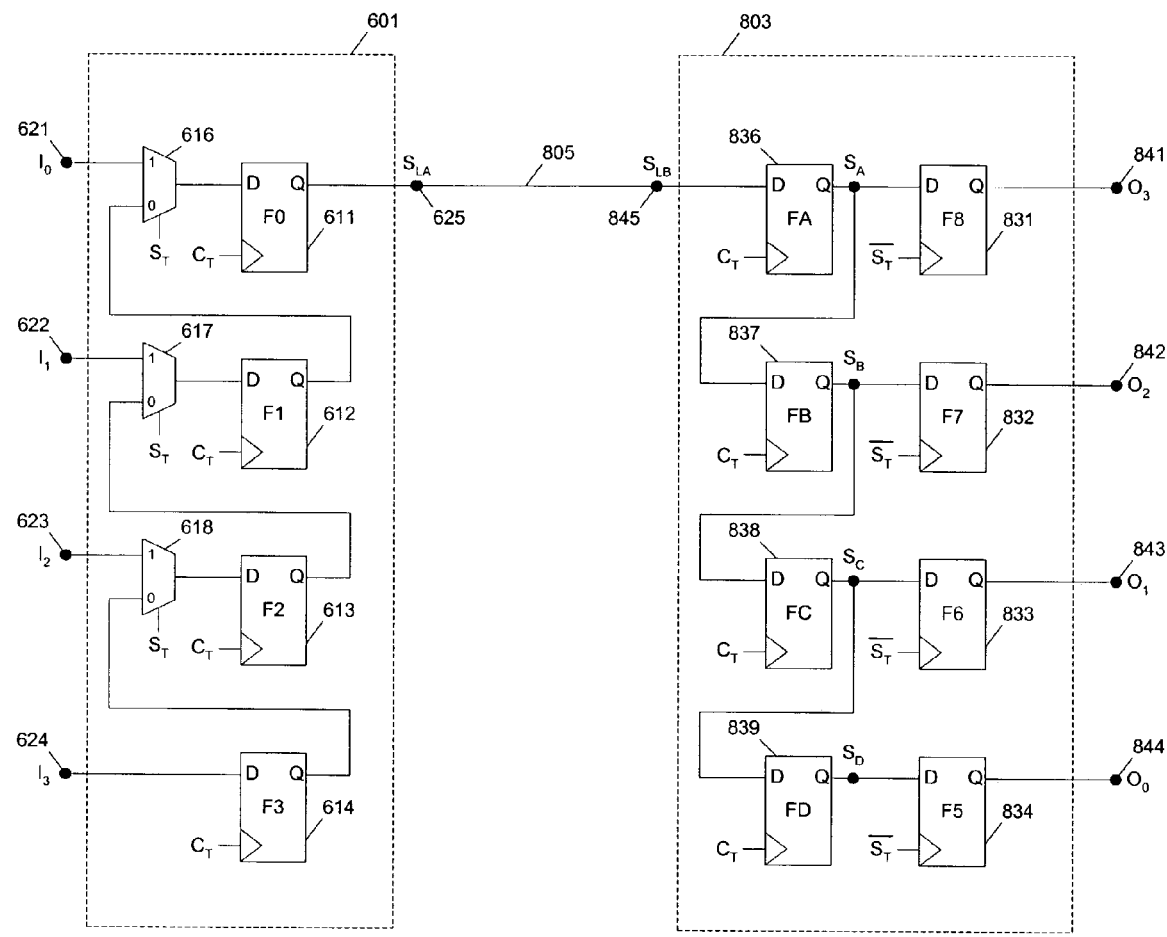
FIG. 8 illustrates another Time Division Multiplexing (TDM) channel which may be used and analyzed according to one embodiment of the present invention.

FIG. 8 illustrates another Time Division Multiplexing (TDM) channel which may be used and analyzed according to one embodiment of the present invention. Sender 601 in FIG. 8 is the same as send 601 in FIG. 6. In FIG. 8, receiver 803 in FIG. 8 contains flip-flops 836–839, which sequentially shift the signals received from $S_{LB}$ (845) in order to reconstruct the output signals on line 841–844.

Figure 9:
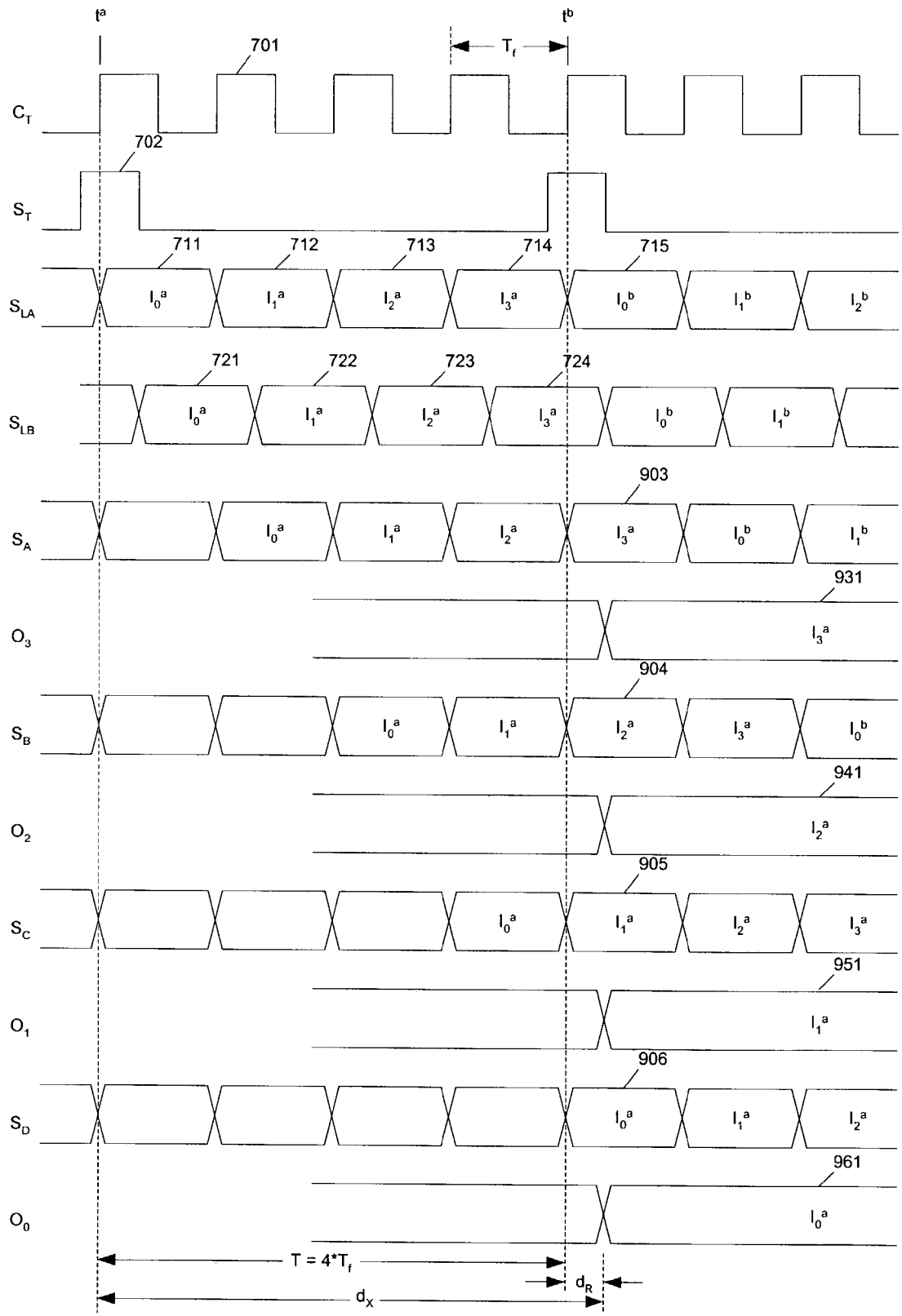
FIG. 9 shows signal waveforms at various locations in the Time Division Multiplexing (TDM) channel of FIG. 8.

FIG. 9 shows signal waveforms at various locations in the Time Division Multiplexing (TDM) channel of FIG. 8. Just after time $t^b$, signals $I_0^a$, $I_1^a$, $I_2^a$ and $I_3^a$, which are sampled at time ta from input lines 621–624 respectively and sequentially transmitted through wire 805 and shifted through flip-flops 836–839, arrive at input ends $S_A$, $S_B$, $S_C$ and $S_D$ as signals 903–906 for flip-flops 831–834 respectively. Signal $\overline{S_T}$ is the inverse of signal $S_T$. Thus, the rising edge of $\overline{S_T}$ (the falling edge of $S_T$) causes flip-flops 831–834 to generate output signals 931, 941, 951 and 961 on output lines 841–844 respectively. Thus, the delay $d_X$ between the sampling of signals $I_0^a$, $I_1^a$, $I_2^a$ and $I_3^a$ at time ta and the reconstructing of the output signals on the output lines for signals $I_0^a$, $I_1^a$, $I_2^a$, and $I_3^a$ is $T+d_R=4$ $T_f+d_R$ for all the connections provided by the TDM channel, where dR is the delay between the arrival of the signals at the input ends of flip-flops 831–834 and the generating of corresponding output signals from flip-flops 831–834.

Since the signals are sampled and transmitted by the TDM channel in certain time slots, the delay between the sampling of a signal at the TDM sender and the outputting of the signal at the TDM receiver is only a portion of the delay caused by the TDM channel. More details are described below.

Figure 10:
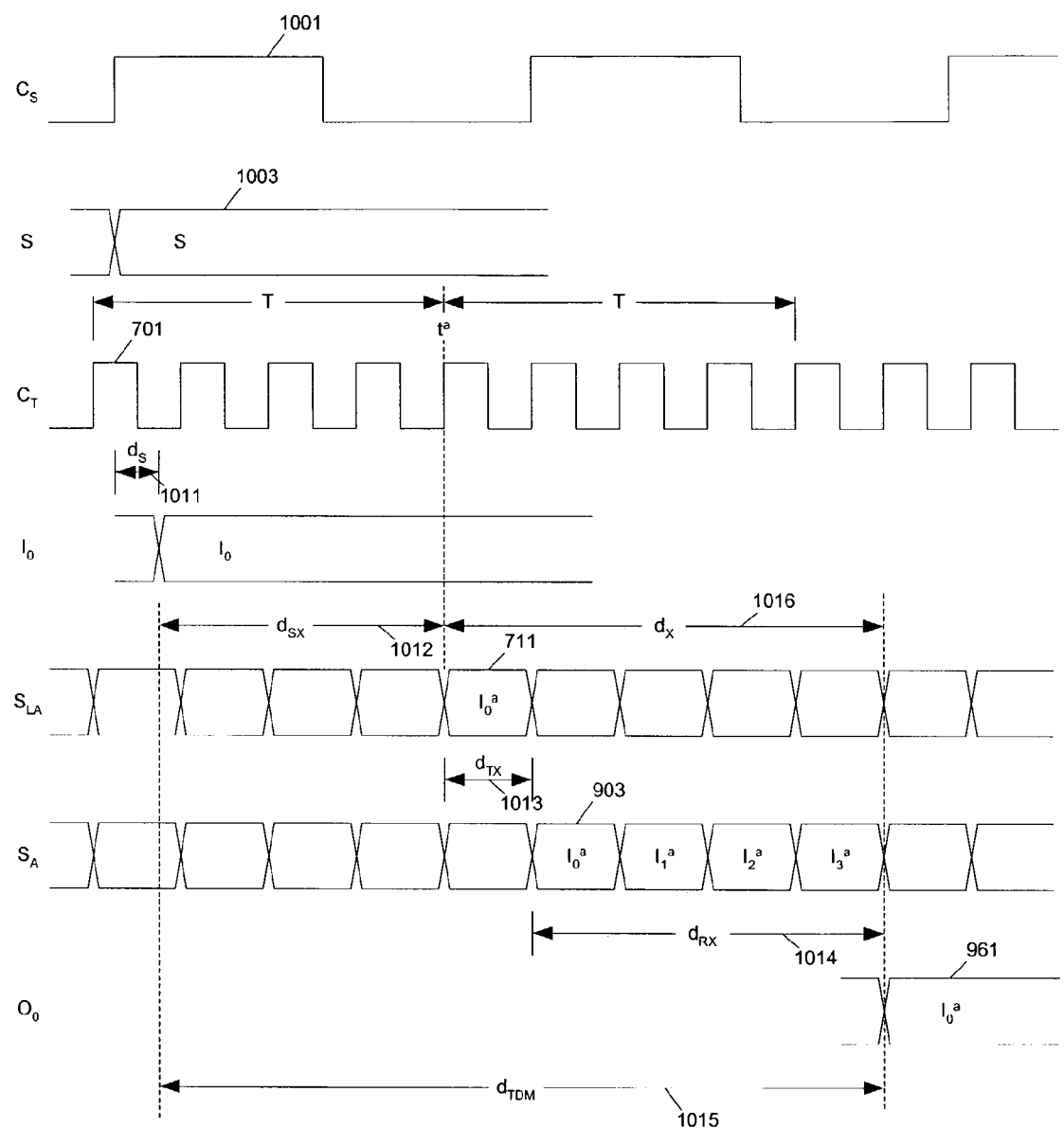
FIG. 10 shows a method to determine a signal delay for a connection due to the Time Division Multiplexing (TDM) channel according to one embodiment of the present invention.

FIG. 10 shows a method to determine a signal delay for a connection due to the Time Division Multiplexing (TDM) channel according to one embodiment of the present invention. In FIG. 10, consider that signal S (1003) starts to propagate from a sequential element of a sending logic block according to the system clock $C_S$ (1001) for the logic block. After a delay $d_S$ (1011), a corresponding input signal $I_0$ arrives at the input end of a TDM channel. After a delay $d_{SX}$ (1012), the TDM channel samples signal $I_0$. The delay for transmitting the sampled signal from the TDM sender to the TDM receiver in a time slot is $d_{TX}$(1013). The delay for the TDM receiver to generate output according to the transmitted signal is $d_{RX}$ (1014). Thus, the total delay $d_{TDM}$ (1015) caused by the TDM channel is:

$$d_{TDM}=d_{SX}+d_{TX}+d_{RX}$$

Since the TDM channel typically samples the input signals at a period of $T=nT_f$, where n is the number of slots of the TDM channel, $d_{SX}<nT_f$. Since the signal for one connection is transmitted in one slot, delay $d_{TX}$ due to the transmission between the TDM sender and the TDM receiver is typically at least $T_f$. When the TDM channel is pipelined with m sequential elements, the delay due to the transmission between the TDM sender and the TDM receiver is typically (m+1) $T_f$. Further, delay $d_{RX}$ for the TDM receiver to generate the output according to the transmitted signal is typically less than $T=nT_f$. Thus, an upper bound $d_e$ for a connection provided by a typical TDM channel is:

$$d_e=(2n+m+1)T_f=nT_f+(m+1)T_f+nT_f$$

$$>d_{SX}+d_{TX}+d_{RX}$$

$$=d_{TDM}$$

In general, the delay $d_X$ (1016) in a connection for a TDM channel between the sampling of input signals at the input end of a TDM channel and the generating of output signal at the output end of the TDM channel can be obtained deterministically from the clock signal of the TDM channel. Considering the uncertainty in timing between the arrival of the signal at the input end of the TDM channel with respect to the clock timing of the TDM channel, which causes delay $d_{SX}<T=nT_f$, an upper bound of the delay can be expressed as:

$$d_e=nT_f+d_x<d_{SX}+d_x=d_{TDM}$$

For example, the upper bounds for the four connections in the FIG. 6 are (n+1) $T_f$, (n+2) $T_f$, (n+3) $T_f$ and (n+4) $T_f$ respectively. These upper bounds can be used to determine the delays for the delay elements (e.g., 501–507 in FIG. 5) or the corresponding delays in the ideal TDM channel.

When a connection is assigned to more than one slot so that the signal for this connection is sampled at a period smaller than or equal to $T_x=k$ $T_f$, where k<n, the upper bound can be reduced. More details are described below.

Figure 11:
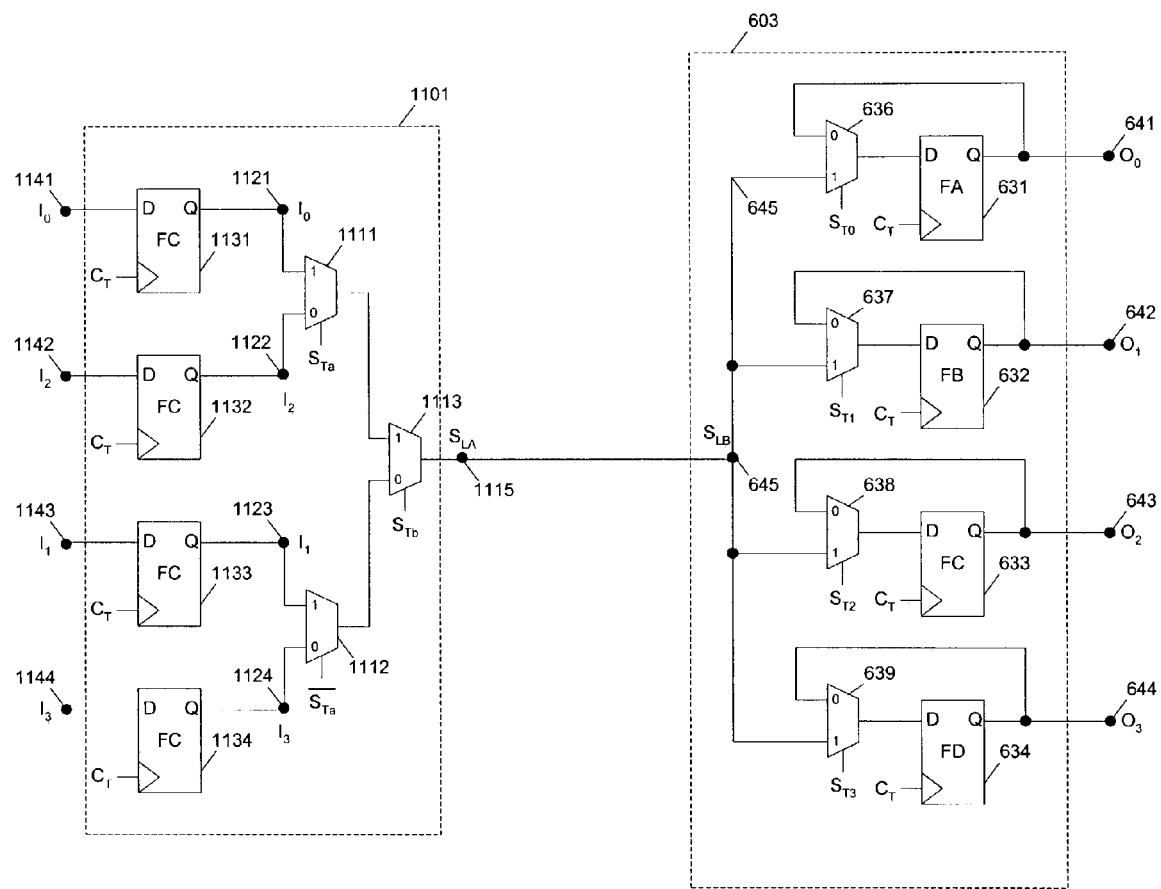
FIG. 11 illustrates another Time Division Multiplexing (TDM) channel which may be used and analyzed according to one embodiment of the present invention.

FIG. 11 illustrates another Time Division Multiplexing (TDM) channel which may be used and analyzed according to one embodiment of the present invention. Receiver 603 in FIG. 11 is the same as receiver 603 in FIG. 6. In FIG. 11, sender 1101 in FIG. 11 contains multiplexers 1111–1113, which assign the input signals on input lines 1121–1124 at different time slots in TDM clock domain. Flip-flops 1131–1134 of sender 1101 sample input signals on lines 1141–1144 respectively according to TDM clock CT to synchronize the input signals on lines 1141–1144 with the TDM clock domain.

Figure 12:
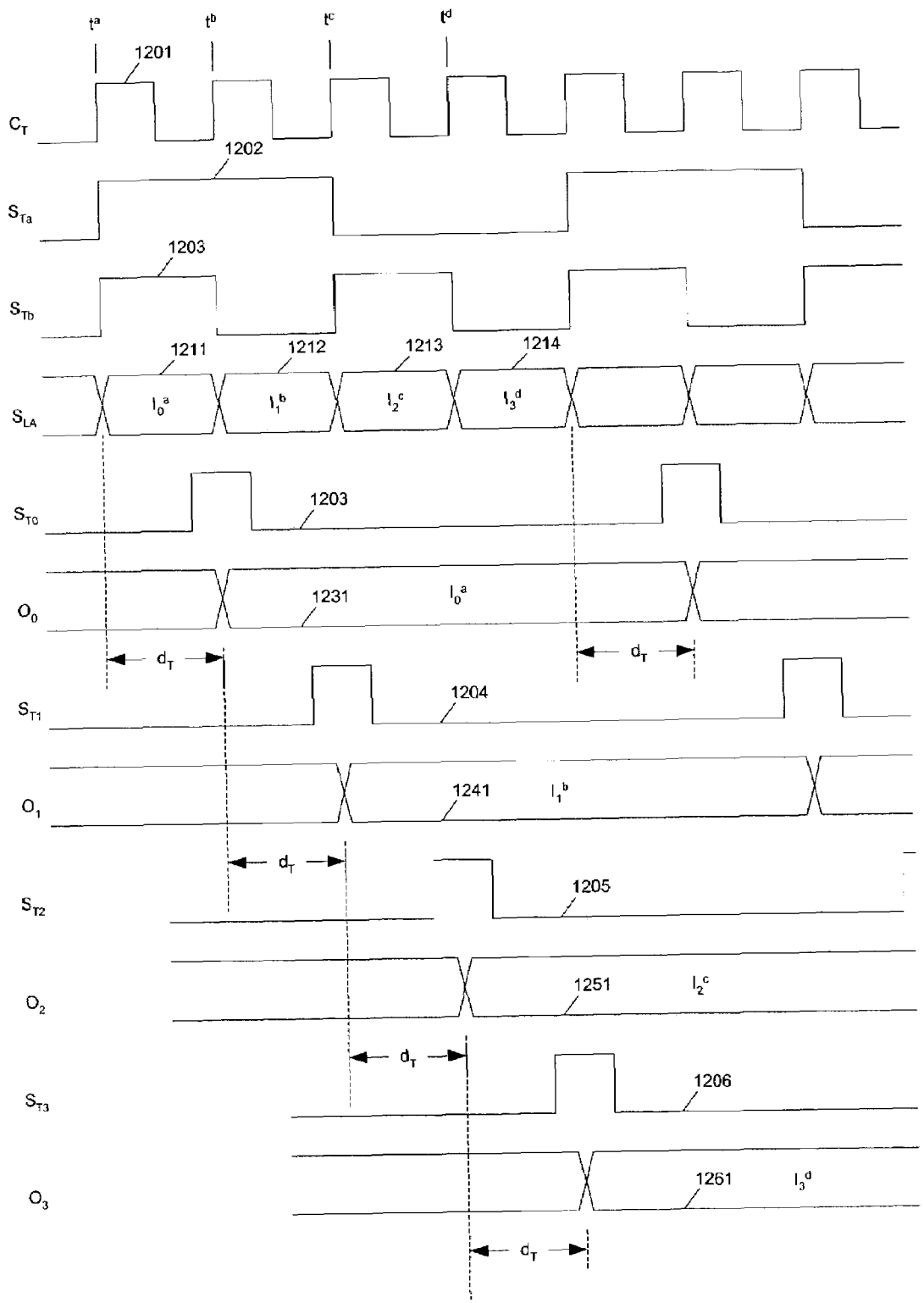
FIG. 12 shows signal waveforms at various locations in the Time Division Multiplexing (TDM) channel of FIG. 11.

FIG. 12 shows signal waveforms at various locations in the Time Division Multiplexing (TDM) channel of FIG. 11. Control signals $S_{Ta}$ (1202) and $S_{Tb}$ (1203) are synchronized with clock signal $C_T$ (1201) to cause multiplexers 1111–1113 to connect input lines 1121–1124 to $S_{LA}$ (1115) one at a time in their respective time slots 1211–1214. Control signals $S_{T0}$–$S_{T2}$ (1203–1206) for multiplexers 636–639 in FIG. 11 cause flip-flops 631–634 to reconstruct signals $I_0{}^a$ (1231), $I_1{}^b$ (1241), $I_2{}^c$ (1251) and $I_3{}^d$ (1261) on output lines 641–644 in FIG. 11 according to signals $I_0{}^a$, $I_1{}^b$, $I_2{}^c$ and $I_3{}^d$ (1211–1214) sampled at times $t^a$, $t^b$, $t^c$ and $t^d$ respectively. Thus, delay $d_X$ for each of the connection provided by the TDM channel between sampling at the input end and generating an output is $d_T=T_f$ (assuming that the delays caused by the mulplexers are small enough). Each slot samples the corresponding input signal at a period of $T=nT_f$. Considering the uncertainty ($d_{SX}<nT_f$) in the timing of the arrival of the input signal (e.g., signal 1141) with respect to the timing of sampling (e.g., the rising edge of $C_T$ for flip-flop 1131), an upper bound of the delay for each of the connection is:

$$d_e=(n+1)T_f=nT_f+d_T<d_{SX}+d_T=d_{TDM}$$

However, when a connection is assigned to more than one slot, the frequency for sampling the signal for this connection can be increased. Thus, the delay due to the uncertainty in the timing of the arrival of the input signal with respect to the timing of sampling can be reduced.

Figure 13:
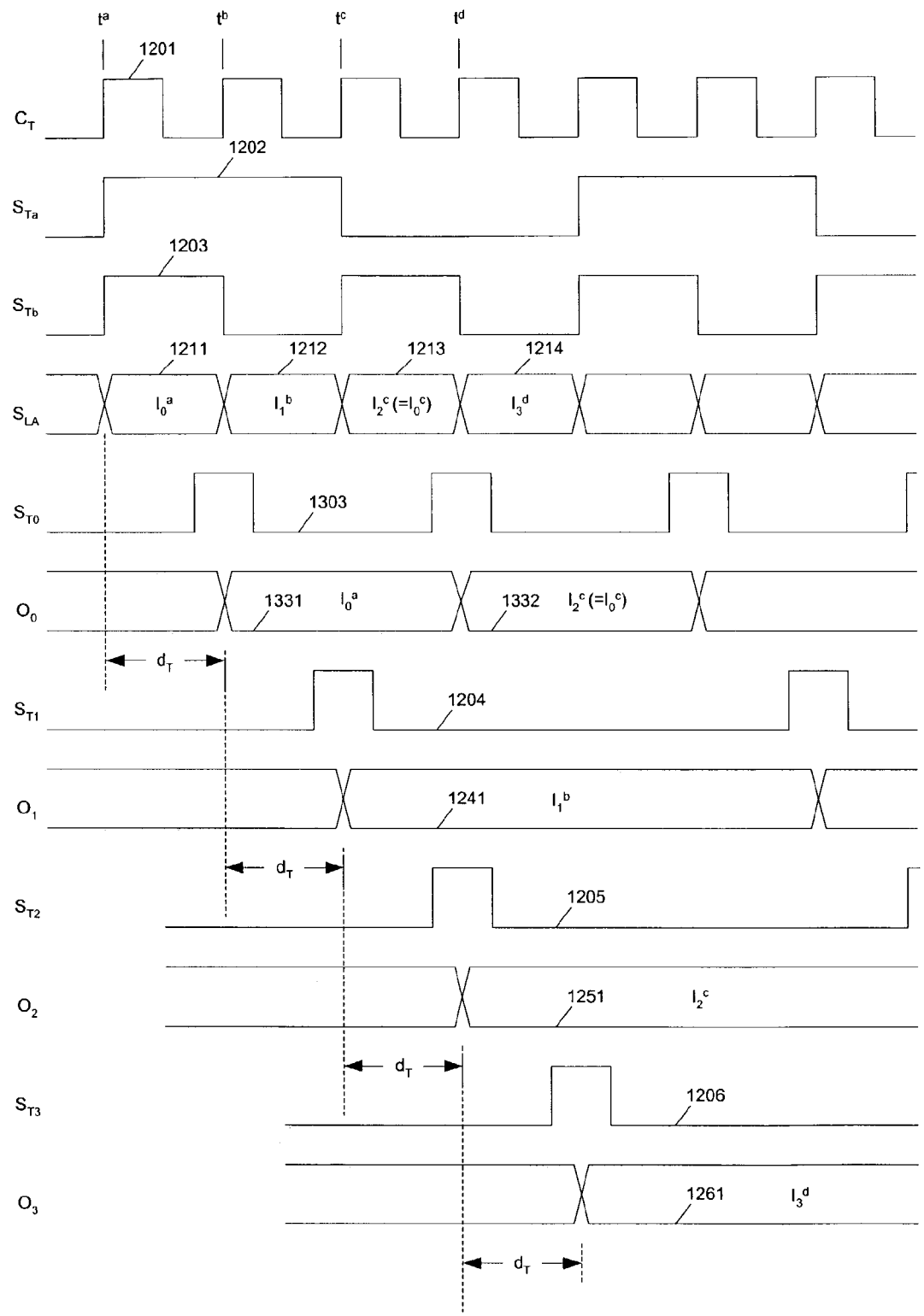
FIG. 13 shows a method to reduce a signal delay for a connection due to the Time Division Multiplexing (TDM) channel according to one embodiment of the present invention.

Consider that both input lines 1121 and 1122 (or lines 1141 and 1142) are assigned to a same connection; and, control signal $S_{T0}$ of the form 1303 in FIG. 13 is used for multiplexer 636 in FIG. 11. Control signal $S_{T0}$ of the form 1303 in FIG. 13 can be generated from an OR operation on the signals 1203 and 1205 in FIG. 12. The signal on the connection between input line 1121 (or 1122) and output line 641 in FIG. 11 is sampled at a period of 2 $T_f=(n/2) T_f$, when two slots (e.g., 1211 an 1213 in FIG. 13) are assigned to the same connection. Thus, the delay due to the uncertainty in the arrival of the input signal is reduced to (n/2) $T_f$; and, the upper bound for this connection is reduced to $d_e=(n/2+1)T_f$, while the upper bound for other connections remains as $d_e=(n+1)T_f$. It is understood that different distributions of the slots assigned to a particular signal can result in different delays for the signal. For example, if the two slots assigned to a signal were the first two slots (e.g., 1211 and 1212), the largest period for sampling the signal would be 3 $T_f$, since the time gap between the second slot and the first slot in the next cycle was 3 $T_f$, which could cause extra delay for this signal. Thus, it is desirable to distribute the multiple slots assigned one signal as evenly as possible.

Figure 14:
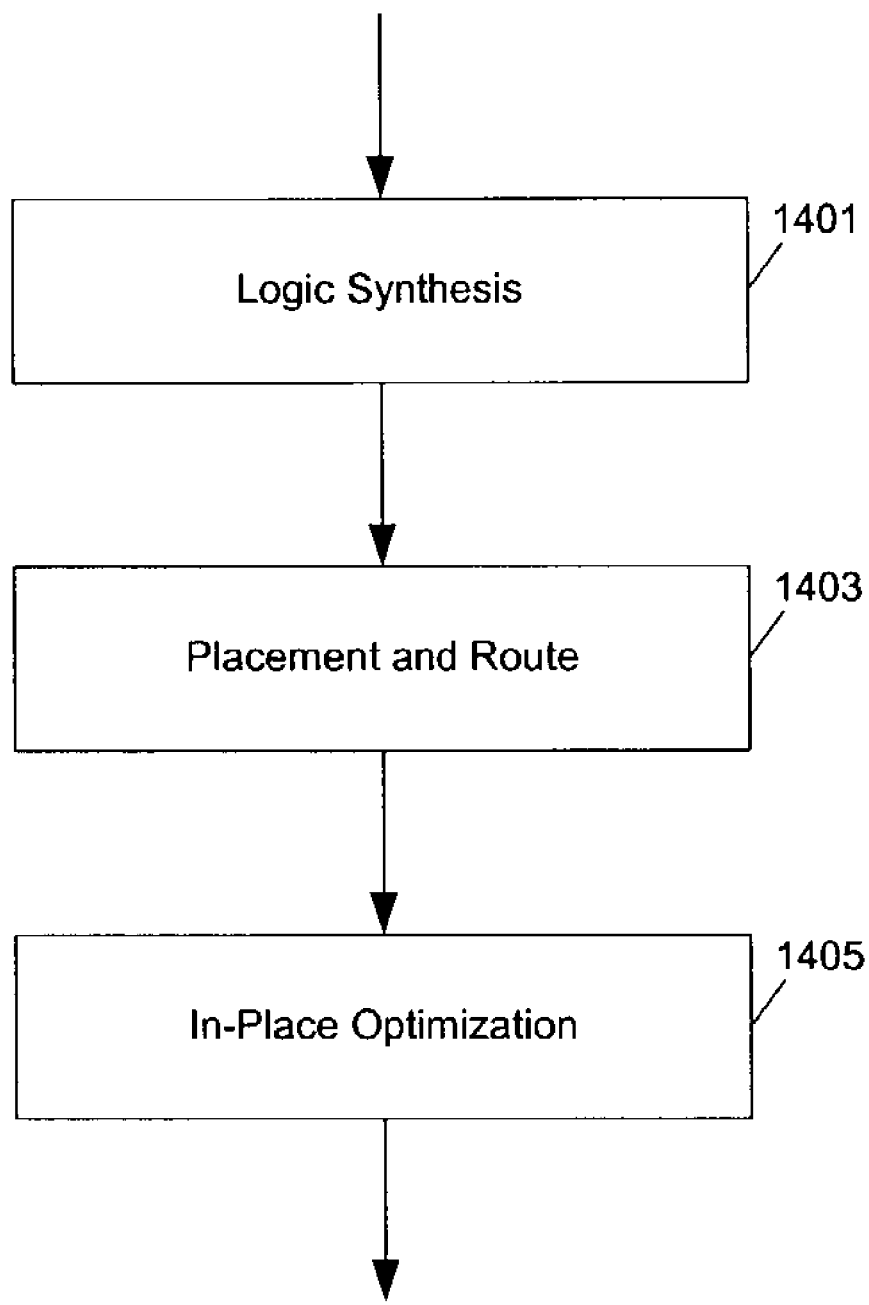
FIG. 14 shows a flow chart of a typical method to design a digital circuit.

FIG. 14 shows a flow chart of a typical method to design a digital circuit. Operation 1401 performs logic synthesis to create a logic element network that performs a given set of functions. The logic synthesis operation may transform and restructure the logic to optimize delays, areas and other design goals. The gate-level logic elements are mapped to vendor specific primitives which are placed into various blocks on the chip. Methods for analyzing the timing of a TDM channel can be used in operation 1401 for optimizing or budgeting delays and for timing driven transformations. Operation 1403 places the vendor specific primitives on the chip and routes the wires between the primitives. The results of methods for analyzing the timing of a TDM channel can be used in operation 1403 for timing driven placing and routing. In place optimizations (e.g., transister resizing, buffer insertion, increment routing and/or placement) are typically performed in operation 1405 to optimize timing. In place optimizations, for example, change the physical characteristics (e.g., size) of the logic elements without changing the placement of the logic elements, which essentially tweak transistor sizes without moving the logic elements around. A detailed timing analysis (e.g., static timing analysis or timing simulation) is typically performed after the in place optimization to verify that all the timing requirements are satisfied. The timing analysis of a TDM channel using various methods according to embodiments of the present invention can be used in various stages of the design, for example, in estimating or budgeting slacks when partitioning the circuit in different regions (e.g., IP blocks, ASIC blocks, FPGA blocks) on the chip, in floor planning, in timing driven placement, in optimizing routing, or in other timing based transformations. Further, the timing analysis according to embodiments of the present invention can be used for analyzing a TDM channel between chips (inter-chip connections) or between circuit boards (inter-board connections).

Figure 15:
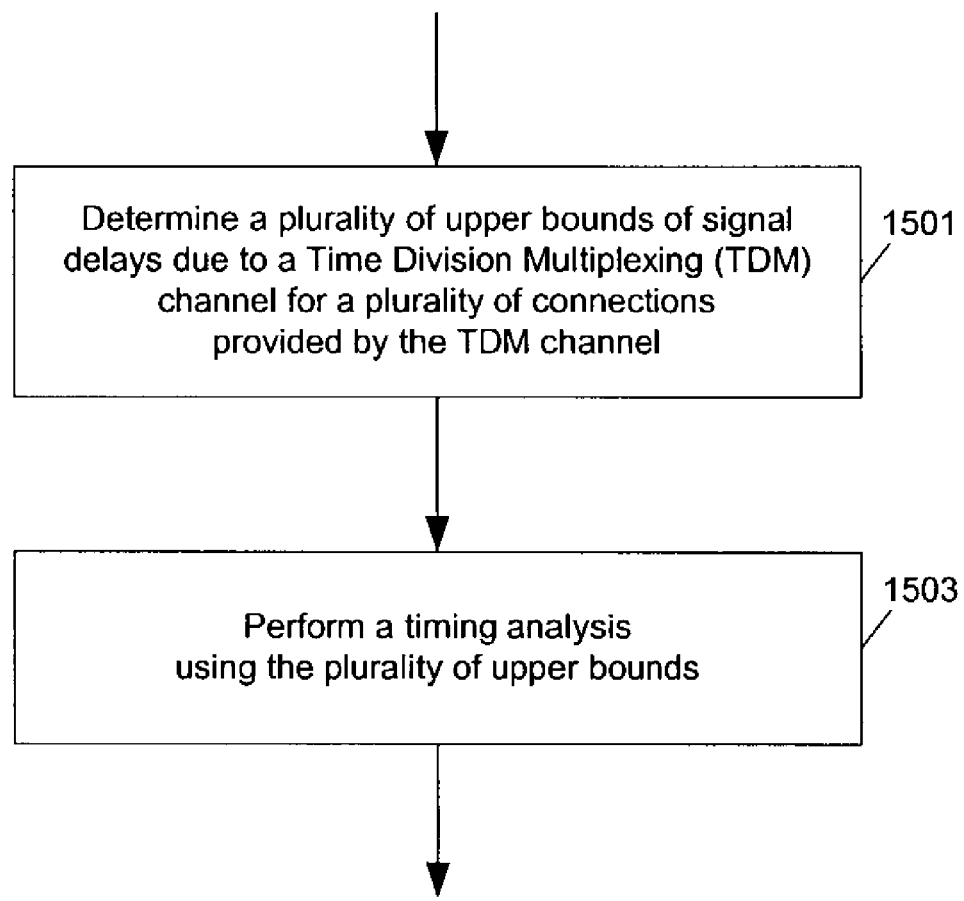
FIG. 15 shows a method of analyzing a digital circuit with a Time Division Multiplexing (TDM) channel according to one embodiment of the present invention.

FIG. 15 shows a method of analyzing a digital circuit with a Time Division Multiplexing (TDM) channel according to one embodiment of the present invention. Operation 1501 determines a plurality of upper bounds of signal delays due to a Time Division Multiplexing (TDM) channel for a plurality of connections provided by the TDM channel. Operation 1503 performs a timing analysis using the plurality of upper bounds.

Figure 16:
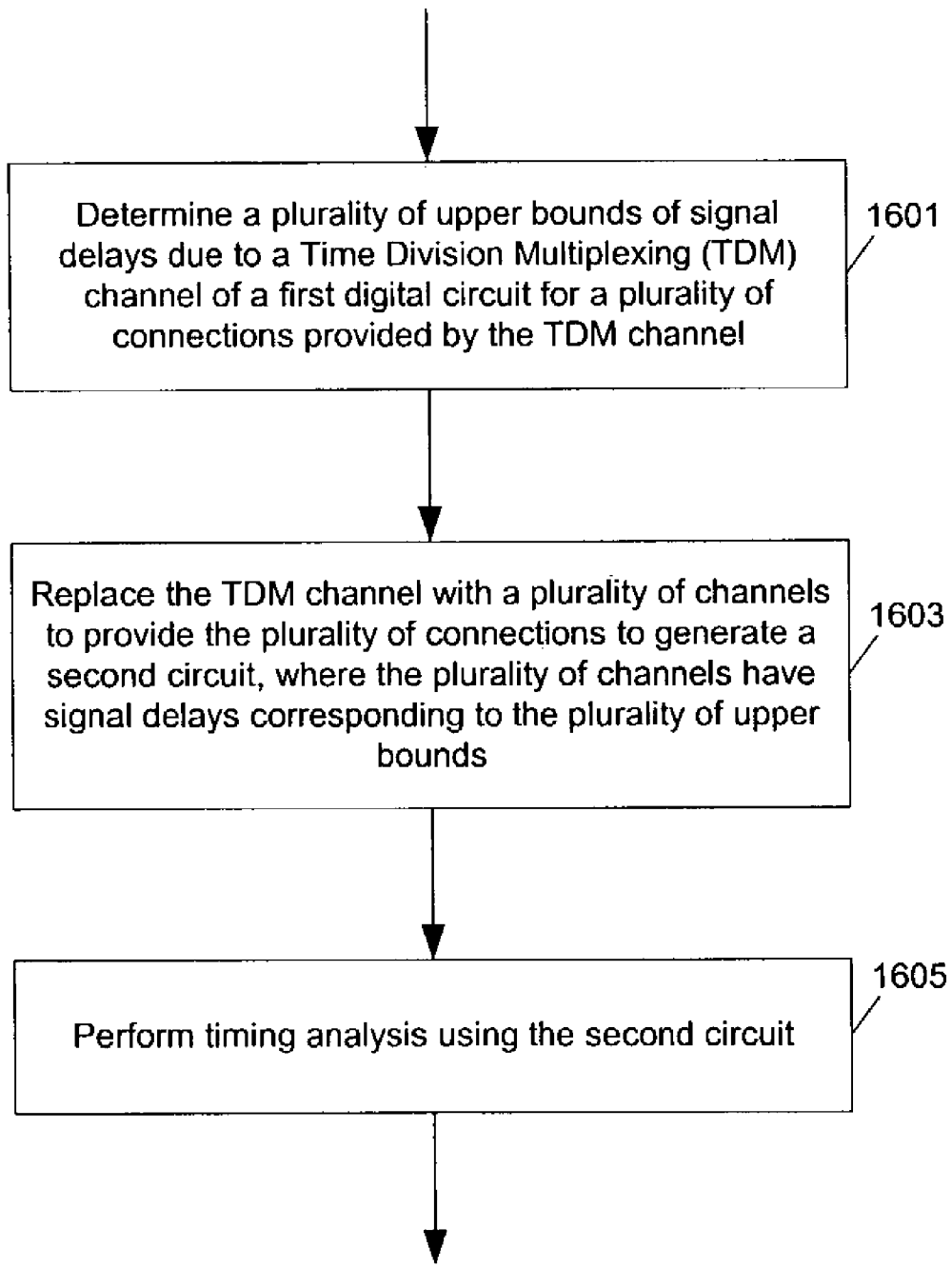
FIG. 16 shows a detailed method to analyze a digital circuit with a Time Division Multiplexing (TDM) channel according to one embodiment of the present invention.

FIG. 16 shows a detailed method to analyze a digital circuit with a Time Division Multiplexing (TDM) channel according to one embodiment of the present invention. Operation 1601 determines a plurality of upper bounds of signal delays due to a Time Division Multiplexing (TDM) channel of a first digital circuit for a plurality of connections provided by the TDM channel. Operation 1603 replaces the TDM channel with a plurality of channels to provide the plurality of connections to generate a second circuit, where the plurality of channels have signal delays corresponding to the plurality of upper bounds. Operation 1605 performs timing analysis using the second circuit.

Figure 17:
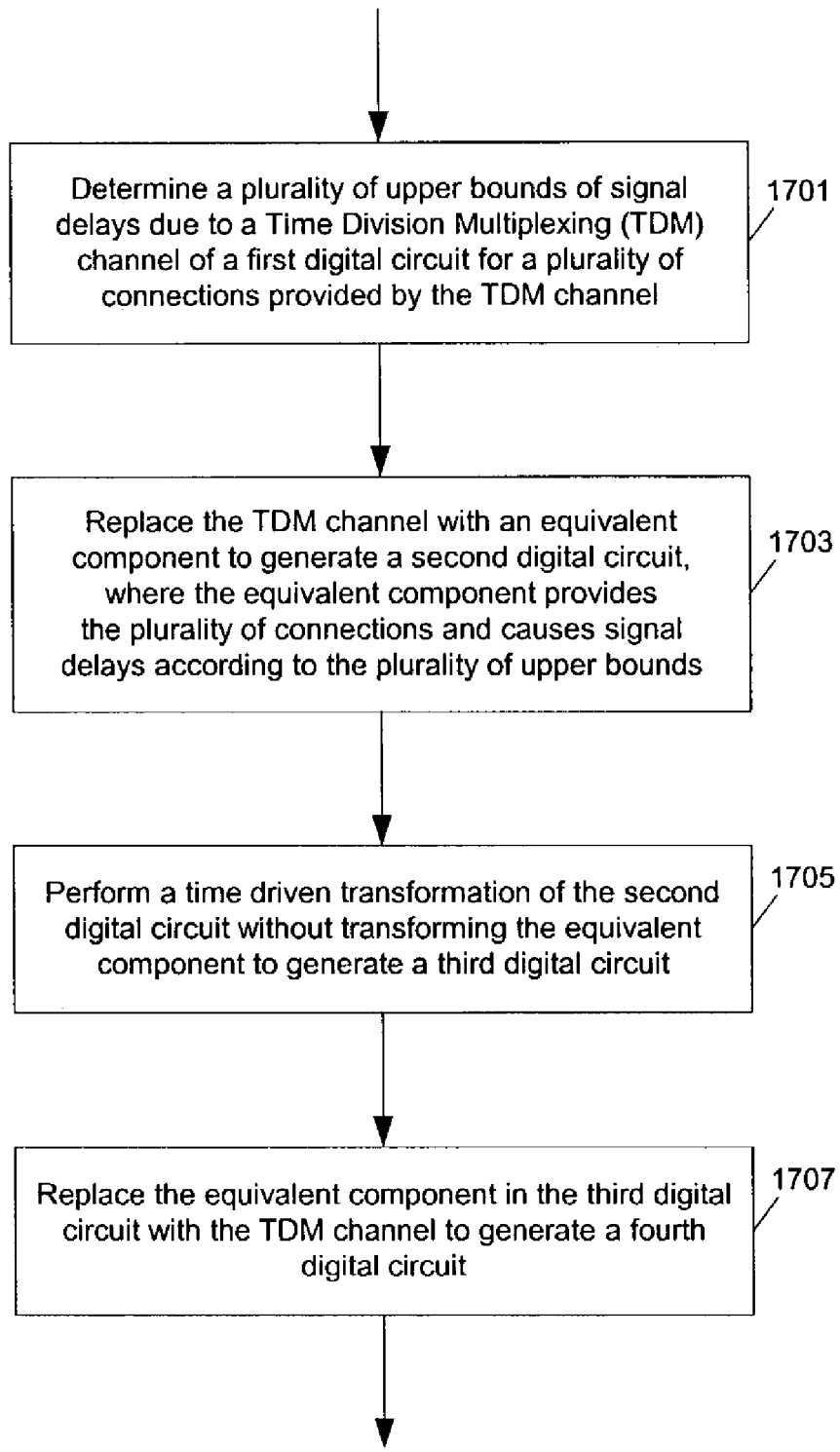
FIG. 17 shows another detailed method to analyze a digital circuit with a Time Division Multiplexing (TDM) channel according to one embodiment of the present invention.

FIG. 17 shows another detailed method to analyze a digital circuit with a Time Division Multiplexing (TDM) channel according to one embodiment of the present invention. Operation 1701 determines a plurality of upper bounds of signal delays due to a Time Division Multiplexing (TDM) channel of a first digital circuit for a plurality of connections provided by the TDM channel. Operation 1703 replaces the TDM channel with an equivalent component to generate a second digital circuit, where the equivalent component provides the plurality of connections and causes signal delays according to the plurality of upper bounds. Operation 1705 performs a time driven transformation of the second digital circuit (e.g., synthesizing a portion of the second digital circuit, placing and routing a portion of the second digital circuit, partitioning a portion of the second digital circuit, floor planning a portion of the second digital circuit, or others) without transforming the equivalent component to generate a third digital circuit. Operation 1707 replaces the equivalent component in the third digital circuit with the TDM channel to generate a fourth digital circuit.

Figure 18:
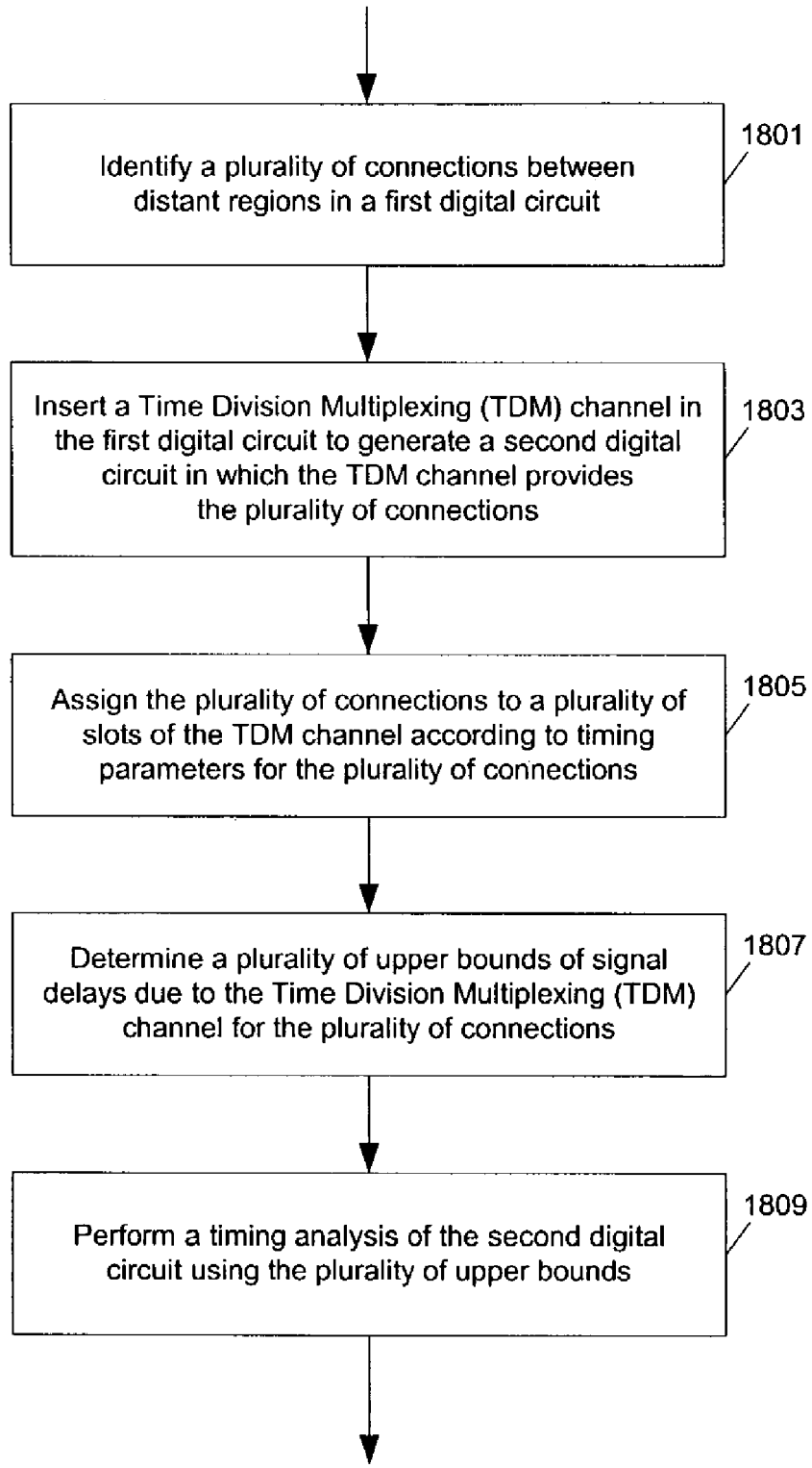
FIG. 18 shows a method to design a digital circuit with a Time Division Multiplexing (TDM) channel according to one embodiment of the present invention.

FIG. 18 shows a method to design a digital circuit with a Time Division Multiplexing (TDM) channel according to one embodiment of the present invention. Operation 1801 identifies a plurality of connections between distant regions in a first digital circuit. Good candidate connections are those on multi-cycle and false paths because their required periods are large compared to the system clock. Operation 1803 inserts a Time Division Multiplexing (TDM) channel in the first digital circuit to generate a second digital circuit in which the TDM channel provides the plurality of connections. Operation 1805 assigns the plurality of connections to a plurality of slots of the TDM channel according to timing parameters for the plurality of connections. For example, multiple slots can be assigned to a connection for a timing critical path. Operation 1807 determines a plurality of upper bounds of signal delays due to the Time Division Multiplexing (TDM) channel for the plurality of connections. Operation 1809 performs a timing analysis of the second digital circuit using the plurality of upper bounds.

Figure 19:
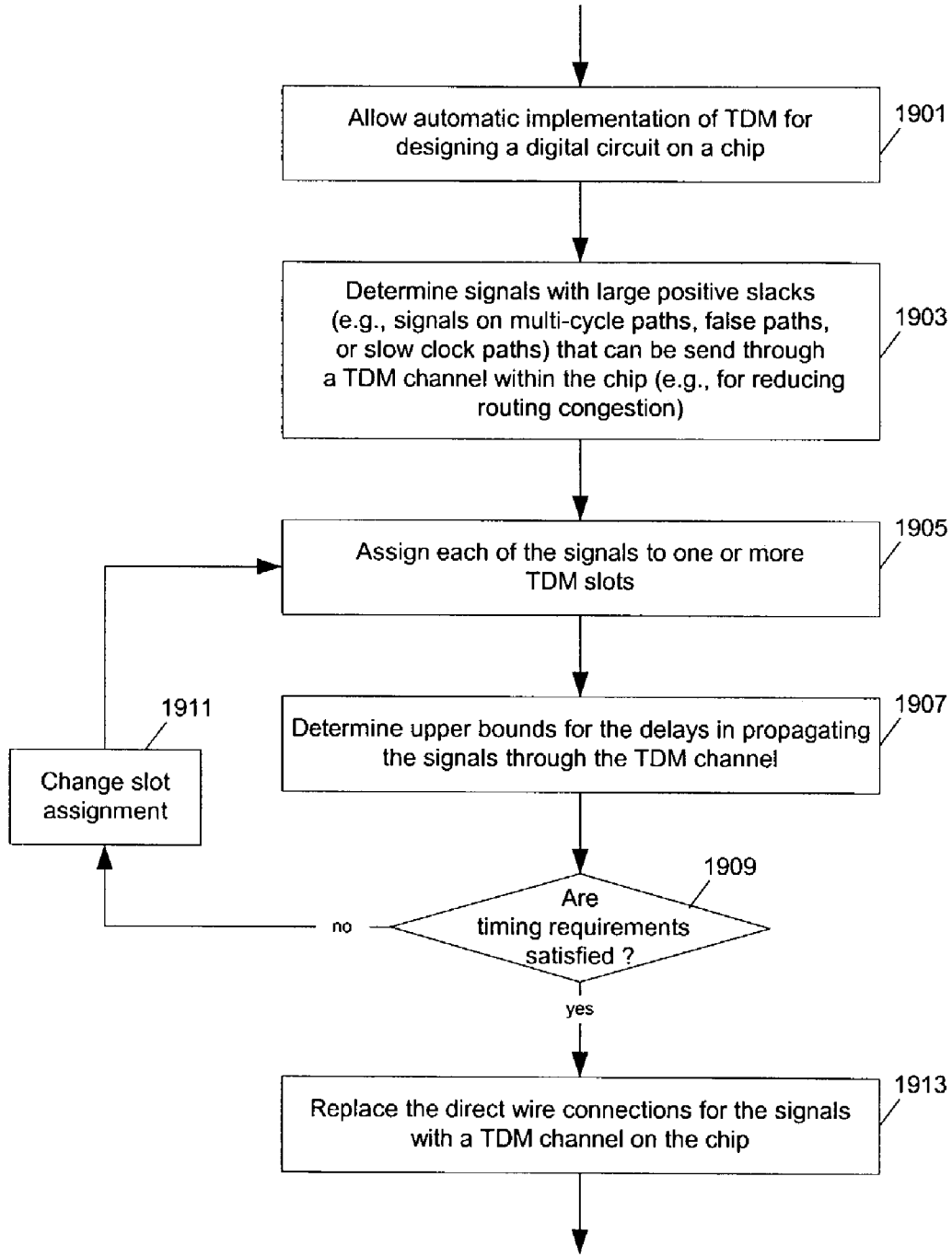
FIG. 19 shows a method to automatically implement TDM to reduce on chip routing congestion according to one embodiment of the present invention.

FIG. 19 shows a method to automatically implement TDM to reduce on chip routing congestion according to one embodiment of the present invention. In this embodiment, a software tool can be configured to automatically implement TDM in designing a digital circuit on a chip. After the automatic implementation of TDM for designing a digital circuit on a chip is allowed in operation 1901, operation 1903 determines signals with large positive slacks (e.g., signals on multi-cycle paths, false paths, slow clock paths (paths controlled by a clock slower than the system clock), or others) that can be send through a TDM channel within the chip (e.g., for reducing routing congestion, or in response to the determination of the lack of enough routing resources). Operation 1905 assigns each of the signals to one or more TDM slots; and, operation 1907 determines upper bounds for the delays in propagating the signals through the TDM channel to account for the uncertainties in the propagation of the signals (e.g., due to the asynchronicity of the TDM clock, differences in the different TDM hardware that may be selected in a later phase of the design, or others). If operation 1909 determines that the timing requirements for the signals are satisfied, operation 1911 replaces the direct wire connections for the signals with the TDM channel on the chip. If the timing requirements for some of the signals are not satisfied, operation 1911 changes slot assignments (e.g., by assigning multiple slots to a timing critical signal) to reduce the delay in these signals to improve timing. Alternative, a different TDM channel or a different type of TDM channel may be used to satisfy the timing requirements. More than one TDM channel can be used to reduce the number of wires for connecting different regions on a chip in order to reduce required routing resource. Each TDM channel can have one or more physical wires for transmitting signals in their original form, or in an encoded format (e.g., when the TDM channel has more than one physical communication wire). Further, it is understood that a TDM channel can have multiple senders (e.g., for different sending regions); and, a TDM channel can also have multiple receivers (e.g., for different receiving regions).

Figure 20:
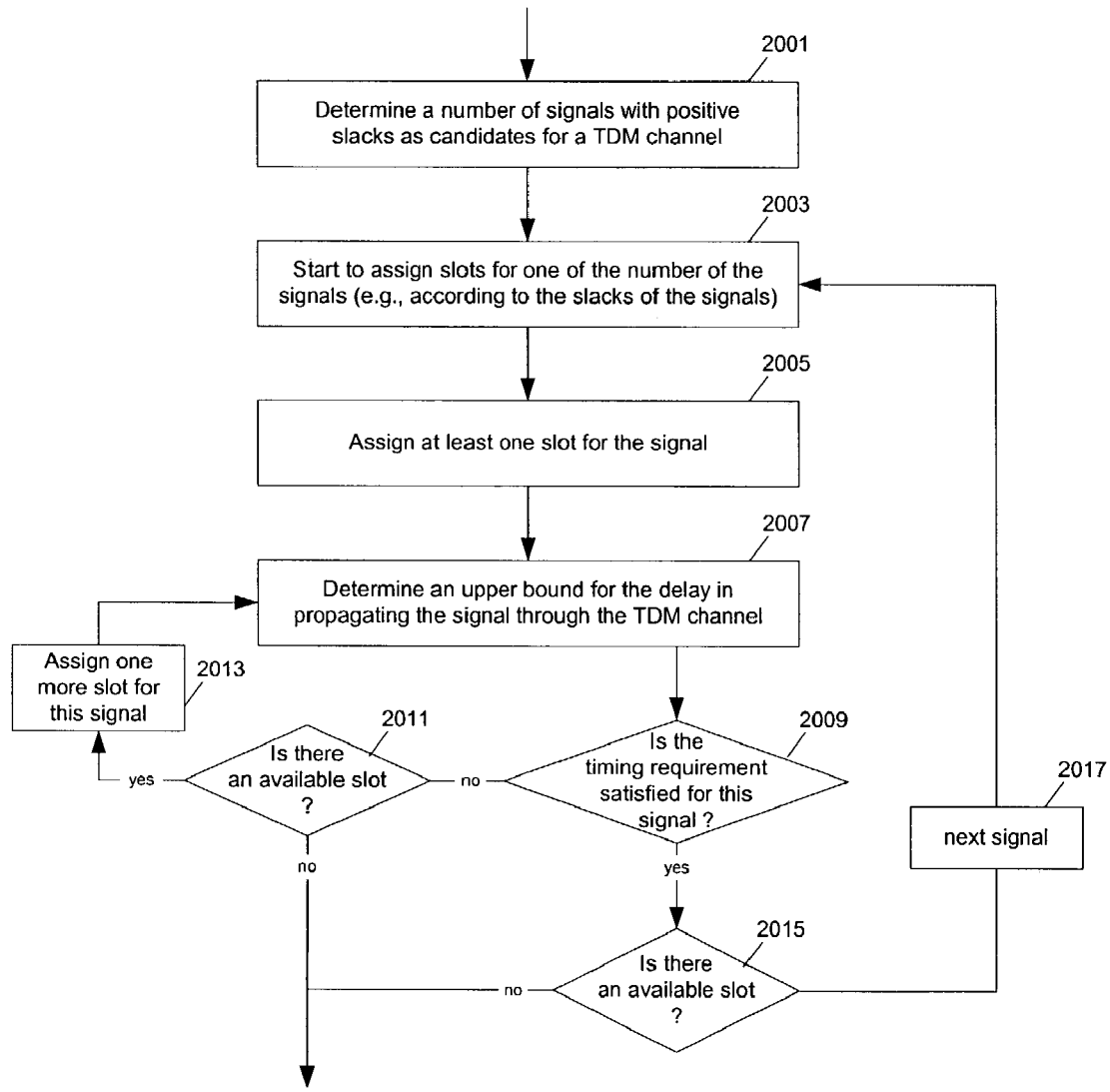
FIG. 20 shows a method to assign signals to TDM slots according to one embodiment of the present invention.

FIG. 20 shows a method to assign signals to TDM slots according to one embodiment of the present invention. After operation 2001 determines a number of signals with positive slacks as candidates for a TDM channel, operation 2003 starts to assign slots for the signals one at a time (e.g., according to the slacks of the signals where the signal with the largest slack is assigned slots first). Operation 2005 assigns at least one slot for the signal (e.g., according to the relation between the upper bound for the delay in the signal and the number of slots assigned for the signal, or starting with one slot for the signal). Operation 2007 determines an upper bound for the delay in propagating the signal through the TDM channel (e.g., after the particular TDM slots for the signal is determined). If operation 2009 determines that the timing requirement for this signal is satisfied and operation 2015 determines that there is at least one available TDM slot, operation 2017 starts to process the next signal. If operation 2009 determines that the timing requirement for this signal is not satisfied and operation 2011 determines that there is at least one available TDM slot, operation 2013 assigns one more slot for this signal. When there are not enough slots in a TDM channel, the remaining signals can be transmitted using other TDM channels, or direct wire connections. Different types TDM hardware may be available for use on a given chip. Thus, a software tool can select different combinations of TDM hardware to optimize the design. Further, the software tool distributes the multiple TDM slots assigned to each signal as even as possible to minimize the delay for the signal. From this description, a person skilled in the art can envision various alternative detailed methods to assign TDM slots to signals in optimizing the computational time and in optimizing the signal delay associated with slot distributions.

In General, consider a system with two subsystems (e.g., logic blocks 201 and 203) connected by a TDM channel as shown in FIG. 4. In FIG. 4 four signals between the sending subsystem and the receiving subsystem are transferred over a physical communication channel of width two. Thus, the TDM channel has a 4:2 ratio. Let $T_s$ be the period of the system clock $C_S$ and $T_f$ the period of the TDM clock $C_T$. In FIG. 4 the TDM channel is pipelined with extra m=2 registers operating at the TDM frequency. Pipelining is typically used if the wire delay of the TDM channel between the TDM sender and the TDM receiver is more than $T_f$ when the TDM channel is not pipelined. Consider a path between two sequential elements, one at the sending subsystem and the other at the receiving subsystem. Assume that the delay through the sending subsystem is S' and that the delay through the receiving subsystem is R'. Typically, a timing requirement for the path is:

$$R'+S'<pT_S$$

where p is a positive integer. Typically, p is one. For a multi-cycle path, p is larger than one. Note that there is no timing requirement for a false path.

Since an asynchronous TDM channel has a TDM clock ($T_f$) that is not synchronized with the system clock ($T_s$), in general, there is an arbitrary offset between the system clock and the TDM clock. In the following analysis example, it is assumed that all sequential elements (e.g., flip-flops) in both the original circuit and the TDM hardware change states on the rising edge of their respective clocks. However, from this description, it will be apparent that the analysis for other polarities can be performed in a similar way.

First, consider that a simple round-robin scheme is used to multiplex n signals for n connections in the TDM channel that has n slots. Since each signal gets one TDM slot, the period for sampling each of the signals is effectively $T=nT_f$.

The TDM channel introduces additional delay on the sender side, on the receiver side, and in the channel. A portion of the additional delay is due to the delay, setup time, and clock-to-out time of the TDM circuit itself. Let the increased delay on the sender side be $S \geq S'$, and on the receiver side $R \geq R'$. The equivalent delay of the channel (the delay from the TDM sender to the TDM receiver) is $(m+1)T_f$, where m is the number of sequential elements for pipelining the channel. Another portion is due to asynchronicity of the signals and the TDM clock.

Let the delay in time between a rising edge of a system clock that initiates a signal from the sending sequential element of the path and the immediate following rising edge of the TDM clock for sampling the signal be $t_a$. Note that $t_a$ typically changes in time for an asynchronous TDM channel. In general, only the bounds, not the exact value, for $t_a$ are known because TDM might be asynchronous. If TDM is synchronous, it might be possible to obtain more exact value for $t_a$. Thus, the delay through the sender side S can be expressed as i T+$t_b$, where i=int((S−$t_a$)/T) and $t_b$=S−i T.

Since the signal arrived at the TDM sender side at time t=S is not captured until the next TDM sampling cycle, the TDM channel starts to transmit the signal after a delay of $S_e$=(i+1) T. Thus, the extra delay between the arrival of the signal and the starting of transmission is $S_e$−S=T−$t_b$≦T. Thus, $S_e$≦S+T. Note that the value of $S_e$ can be very close to the upper bound S+T for some values of $t_a$.

In general, an upper bound for the total path delay obtained from the above upper bounds is:

$$D_e = S_e + T + R_e$$

$$< (S+T) + mT_f + R$$

$$= (S+R) + T + m\ T_f$$

$$= D + T + m\ T_f$$

Consider that T=n $T_f$, the upper bound is:

$$D_e < D + (n+m)T_f$$

Thus, the upper bound for the extra delay due to the TDM channel is:

$$(n+m)T_f$$

Once the upper bounds for the delays in the connections due to the TDM channel are obtained, the subsystems connected by the TDM channel can be analyzed in several ways using the upper bounds. One way is to use delay elements, determined according to the upper bounds, to directly connect the sending subsystem and the receiving subsystem, as illustrated in FIG. 5.

Another way is to replace the TDM components with special components that have identical connectivity, but contain no logic. The timing engine is configured to know how to propagate signals through such components. The timing engine: (i) associates corresponding signals at the input of the sender and the output of the receiver; and, (ii) propagates the signals with appropriate delays, which are determined according to the upper bounds. In one embodiment of the present invention, the special components are such that the reduced number of physical links between the sender and the receiver remains the same as the number of physical links between the original TDM sender and the original TDM receiver.

One benefit of the approach of replacing the TDM channel with delay elements or special components (e.g., ideal TDM channel) and eliminating the influence of the clock domain of the TDM channel is that the timing constraints of the original form can be used during transformation (e.g., in optimization, in mapping from a HDL code to RTL netlist, in mapping RTL netlist to technology specific netlist, in timing driven logic synthesis, in timing driven routing and placing, timing driven partitioning, etc.). Moreover, the transformation will be independent of the TDM hardware, since a group of TDM hardware implementation can have the same upper bounds for delays in the connections provided by the TDM channel. In one embodiment of the present invention, the knowledge about the TDM hardware is used to refine the upper bounds. In another embodiment of the present invention, the upper bounds for the delays in the connections are budgeted for the delay elements (or the special components for the modeling of the TDM channel) in the budgeting phase before the specific TDM hardware which meets the delay requirements is used to implement the channel. Thus, the TDM hardware can be added to the transformed circuit as a post-processing step.

Further, the transformed circuit without TDM hardware can be simulated, as long as the TDM-induced delays are incorporated, to reduce the simulation time. Typically, the TDM hardware is complex; and, a reduced time step for taking into account of the TDM clock in simulation can greatly increase the cost for simulation, especially for an asynchronous TDM channel. When the TDM hardware is modeled using the upper bounds for the delays in the connections, the influence of the TDM clock on the simulation is eliminated, which greatly reduces the computational cost for the simulation.

In a simple round-robin TDM scheme, the same additional delay (e.g., (2n+m) $T_f$) is added to all signals. However, if there are fewer signals than slots, more than one slot can be assigned to a particular signal, as illustrated in FIG. 13, to increase the frequency for sampling the particular signal for some TDM hardware (e.g., the example as illustrated in FIGS. 11 and 13).

For example, assume that there are 2N−1 signals to be multiplexed over 2N slots. Slots 0 and N can be assigned to the most timing critical signal z, while all other signals get one slot each from the remaining slots. Thus, the signal z is now sampled with the period of T=N $T_f$, while the other signals are sampled with the period of 2 N $T_f$. Thus, an upper bound for the delay caused by the TDM channel for signal z is reduced from (2 N+m) $T_f$ when the signal z is assigned to only one channel to (N+m) $T_f$ when the signal z is assigned to slots 0 and N. When the slots are distributed, the most timing critical signal (e.g., the signal with the worst slack) is allocated the largest number of slots.

Once the number of slots for each of the signals is determined, there are many ways of distributing the multiplexing slots to the set of signals. Assigning multiple slots to a signal causes the signal being sampled at one or more periods. Since the largest sampling period determines the upper bound for the delay in the signal, it is desirable to distribute the slots for the signal as evenly (or, as uniformly) as possible among all the slots to reduce the largest sampling period for the signal.

For some TDM channels (e.g., the example as illustrated in FIG. 6), in which different connections provided by different time slots have different upper bounds, the performance of the system can be optimized by assigning timing slots to the connections according to the timing requirement of the connections (e.g., assigning slots that cause less delays to connections that are more critical in timing).

Typically, the delays for different multiplexed signals are different. When the least amount of extra delay due to a TDM channel is added to the connection that originally has the largest delays, the total delays among all connections are equalized. Therefore, in one embodiment of the invention, the connections with small slack are assigned multiple slots (and/or slots with less delays); and, those with large slack (e.g., multi-cycle or false paths) get one each from the remaining slots.

Thus, at least one embodiment of the present invention efficiently models subsystems connected by a TDM channel by introducing equivalent delays in the connections for the subsystems, where the delays are determined according to the upper bounds of the delays caused by the TDM channel.

The TDM channel is modeled with its equivalent delays. Thus, a transformation tool is allowed to take into account the original constraints and time budgeting of the sending subsystem and the receiving subsystem. The problem of asynchronous clock domains is eliminated; and, simulation time of the multiplexed circuit is also improved. In some embodiments of the present invention, multiple TDM slots are assigned to a particular signal to reduce the equivalent connection delay caused by the TDM channel for the particular signal. In some embodiments of the present invention, timing simulation is performed using the equivalent delays to avoid the simulation of the TDM hardware; and, the simulation time step does not have to be reduced due to asynchronous clock, resulting in reduced simulation time.

When the TDM channel is modeled as equivalent delays, the simulation and transformation of the sending subsystem and the receiving subsystem can be separated, since the timing requirement for the individual subsystems can be easily obtained from timing requirement of the combined sending and receiving subsystems and the equivalent delays. The timing constraints associated for the sending and receiving subsystems can be used in the timing analysis.

Although various examples of this description are shown with a TDM channel connecting one sending subsystem and one receiving subsystem, in general, a TDM channel can involve multiple senders and multiple receivers. However, from this description, it will be apparent to one skilled in the art that various methods described above can also be applied to such TDM channels in a similar way as described above.

While most embodiments of the present invention are intended for use in an HDL design synthesis software, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTs) and associated logic of the integrated circuits which are field programmable gate arrays from Xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application-specific integrated circuits (ASICs).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for timing analysis of a digital circuit, the method comprising:
determining a plurality of equivalent delays for a plurality of connections provided by a Time Division Multiplexing (TDM) channel according to one or more upper bounds of signal delays caused by the TDM channel for the plurality of connections of the digital circuit; and
performing a timing analysis of a portion of the digital circuit using the plurality of equivalent delays.

2. A method as in claim 1 wherein each of the one or more upper bounds includes a component due to uncertainty in arrival of an input signal at an input end of the TDM channel with respect to timing of signal sampling for transmission the input signal through the TDM channel.

3. A method as in claim 2 wherein one of the one or more upper bounds includes a component due to uncertainty in timing of generating an output signal at an output end of the TDM channel with respect to timing of sampling the output signal according to a system clock of the digital circuit.

4. A method as in claim 2 wherein a clock signal of the TDM channel and a system clock of the digital circuit are asynchronous.

5. A method as in claim 1 wherein the timing analysis determines a timing constraint for a portion of the digital circuit.

6. A method as in claim 1 further comprising:
performing a timing driven transformation of a portion of the digital circuit using a result of the timing analysis.

7. A method as in claim 6 wherein the timing driven transformation comprises one of:
a) synthesizing a portion of the digital circuit;
b) placing and routing a portion of the digital circuit;
c) partitioning a portion of the digital circuit; and
d) floor planning a portion of the digital circuit.

8. A method as in claim 1 wherein the timing analysis comprises:
performing timing simulation using the plurality of equivalent delays.

9. A method as in claim 1 further comprising:
identifying the plurality of connections in the digital circuit; and
inserting the TDM channel to provide for the plurality of connections.

10. A method as in claim 9 further comprising:
assigning slots of the TDM channel to the plurality of connections according to timing requirements of the connections.

11. A method as in claim 10 wherein a plurality of the slots of the TDM channel are assigned to one of the plurality of connections.

12. A method as in claim 1, wherein the plurality of equivalent delays are for the plurality of connections respectively.

13. A machine readable medium containing executable computer program instructions which when executed by a digital processing system cause said system to perform a method for timing analysis of a digital circuit, the method comprising:
determining a plurality of equivalent delays for a plurality of connections provided by a Time Division Multiplexing (TDM) channel according to one or more upper bounds of signal delays caused by the TDM channel for the plurality of connections of the digital circuit; and
performing a timing analysis of a portion of the digital circuit using the plurality of equivalent delays.

14. A medium as in claim 13 wherein each of the one or more upper bounds includes a component due to uncertainty in arrival of an input signal at an input end of the TDM channel with respect to timing of signal sampling for transmission the input signal through the TDM channel.

15. A medium as in claim 14 wherein one of the one or more upper bounds includes a component due to uncertainty in timing of generating an output signal at an output end of the TDM channel with respect to timing of sampling the output signal according to a system clock of the digital circuit.

16. A medium as in claim 14 wherein a clock signal of the TDM channel and a system clock of the digital circuit are asynchronous.

17. A medium as in claim 13 wherein the timing analysis determines a timing constraint for a portion of the digital circuit.

18. A medium as in claim 13 wherein the method further comprises:
performing a timing driven transformation of a portion of the digital circuit using a result of the timing analysis.

19. A medium as in claim 18 wherein the timing driven transformation comprises one of:
a) synthesizing a portion of the digital circuit;
b) placing and routing a portion of the digital circuit;
c) partitioning a portion of the digital circuit; and
d) floor planning a portion of the digital circuit.

20. A medium as in claim 13 wherein the timing analysis comprises:
performing timing simulation using the plurality of equivalent delays.

21. A medium as in claim 13 wherein the method further comprises:
identifying the plurality of connections in the digital circuit; and
inserting the TDM channel to provide for the plurality of connections.

22. A medium as in claim 21 wherein the method further comprises:
assigning slots of the TDM channel to the plurality of connections according to timing requirements of the connections.

23. A medium as in claim 22 wherein a plurality of the slots of the TDM channel are assigned to one of the plurality of connections.

24. A medium as in claim 13, wherein the plurality of equivalent delays are for the plurality of connections respectively.

25. A data processing system for timing analysis of a digital circuit, the data processing system comprising:
means for determining a plurality of equivalent delays for a plurality of connections provided by a Time Division Multiplexing (TDM) channel according to one or more upper bounds of signal delays caused by the TDM channel for the plurality of connections of the digital circuit; and
means for performing a timing analysis of a portion of the digital circuit using the plurality of equivalent delays.

26. A data processing system as in claim 25 wherein each of the one or more upper bounds includes a component due to uncertainty in arrival of an input signal at an input end of the TDM channel with respect to timing of signal sampling for transmission the input signal through the TDM channel.

27. A data processing system as in claim 26 wherein one of the one or more upper bounds includes a component due to uncertainty in timing of generating an output signal at an output end of the TDM channel with respect to timing of sampling the output signal according to a system clock of the digital circuit.

28. A data processing system as in claim 26 wherein a clock signal of the TDM channel and a system clock of the digital circuit are asynchronous.

29. A data processing system as in claim 25 wherein the timing analysis determines a timing constraint for a portion of the digital circuit.

30. A data processing system as in claim 25 further comprising:
means for performing a timing driven transformation of a portion of the digital circuit using a result of the timing analysis.

31. A data processing system as in claim 30 wherein said means for performing the timing driven transformation comprises one of:
a) means for synthesizing a portion of the digital circuit;
b) means for placing and routing a portion of the digital circuit;
c) means for partitioning a portion of the digital circuit; and
d) means for floor planning a portion of the digital circuit.

32. A data processing system as in claim 25 wherein said means for performing the timing analysis comprises:
means for performing timing simulation using the plurality of equivalent delays.

33. A data processing system as in claim 25 further comprising:
means for identifying the plurality of connections in the digital circuit; and
means for inserting the TDM channel to provide for the plurality of connections.

34. A data processing system as in claim 33 further comprising:
means for assigning slots of the TDM channel to the plurality of connections according to timing requirements of the connections.

35. A data processing system as in claim 34 wherein a plurality of the slots of the TDM channel are assigned to one of the plurality of connections.

36. A data processing system as in claim 25, wherein the plurality of equivalent delays are for the plurality of connections respectively.

* * * * *